United States Patent
Ando et al.

(10) Patent No.: US 10,692,866 B2
(45) Date of Patent: Jun. 23, 2020

(54) CO-INTEGRATED CHANNEL AND GATE FORMATION SCHEME FOR NANOSHEET TRANSISTORS HAVING SEPARATELY TUNED THRESHOLD VOLTAGES

(71) Applicant: International Business Machines Corporation, Armonk, NY (US)

(72) Inventors: Takashi Ando, Tuckahoe, NY (US); Jingyun Zhang, Albany, NY (US); Choonghyun Lee, Rensselaer, NY (US); Pouya Hashemi, White Plains, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/036,067

(22) Filed: Jul. 16, 2018

(65) Prior Publication Data
US 2020/0020690 A1   Jan. 16, 2020

(51) Int. Cl.
*H01L 27/092* (2006.01)
*H01L 29/786* (2006.01)
(Continued)

(52) U.S. Cl.
CPC .... *H01L 27/0922* (2013.01); *H01L 21/02532* (2013.01); *H01L 21/02603* (2013.01); *H01L 21/28088* (2013.01); *H01L 21/3215* (2013.01); *H01L 21/823807* (2013.01); *H01L 21/823842* (2013.01); *H01L 29/0673* (2013.01); *H01L 29/42392* (2013.01); *H01L 29/4908* (2013.01);
(Continued)

(58) Field of Classification Search
CPC .................................................. H01L 27/1104
See application file for complete search history.

(56) References Cited

U.S. PATENT DOCUMENTS 8,422,273 B2   4/2013   Chang et al.
8,658,518 B1   2/2014   Chang et al.
(Continued)

OTHER PUBLICATIONS

Ando et al, "Effective Work Function Control of TaC/High-k Gate Stack by Post Metal Nitridation," 40th IEEE Semiconductor Interface Specialists Conference, 2009, 2 pages.
Chang et al., "A Dy2O3-capped HfO2 Dielectric and TaCx-based Metals Enabling Low-Vt Single-Metal-Single-Dielectric Gate Stack," 2007 IEEE International Electron Devices Meeting, 2007, 4 pages.
(Continued)

*Primary Examiner* — Kenneth Parker
*Assistant Examiner* — Christopher A Culbert
(74) *Attorney, Agent, or Firm* — Cantor Colburn LLP; Vazken Alexanian

(57) ABSTRACT

Embodiments of the invention are directed to a method of fabricating a semiconductor device. A non-limiting example of the method including performing first fabrication operations to form nanosheet field effect transistor (FET) devices in a first region of a substrate. The first fabrication operations include forming a first channel nanosheet, forming a second channel nanosheet over the first channel nanosheet, forming a first gate structure around the first channel nanosheet, and forming a second gate structure around the second channel nanosheet, wherein an air gap is between the first gate structure and the second gate structure. A dopant is applied to the first gate structure and the second gate structure, wherein the dopant is configured to enter the air gap and penetrate into the first gate structure and the second gate structure from within the air gap.

17 Claims, 18 Drawing Sheets

(51) Int. Cl.

| | |
|---|---|
| *H01L 29/06* | (2006.01) |
| *H01L 29/423* | (2006.01) |
| *H01L 29/49* | (2006.01) |
| *H01L 21/8238* | (2006.01) |
| *H01L 21/02* | (2006.01) |
| *H01L 21/28* | (2006.01) |
| *H01L 21/3215* | (2006.01) |

(52) U.S. Cl.
CPC .. *H01L 29/78651* (2013.01); *H01L 29/78696* (2013.01)

(56) References Cited

U.S. PATENT DOCUMENTS

| | | |
|---|---|---|
| 9,425,293 B1 | 8/2016 | Balakrishnan et al. |
| 9,502,416 B1 | 11/2016 | Kim |
| 9,536,794 B2 | 1/2017 | Chang et al. |
| 9,583,583 B2 | 2/2017 | Sun et al. |
| 2015/0021699 A1 | 1/2015 | Ando et al. |

OTHER PUBLICATIONS

Lin et al., "High Performance 14nm SOI FinFET CMOS Technology with 0.0174 μm 2 Embedded DRAM and 15 Levels of Cu Metallization," 2014 IEEE International Electron Devices Meeting (IEDM), IEEE, 2014, 3 pages.

Schaeffer et al., "Tantalum carbonitride electrodes and the impact of interface chemistry on device characteristics," Journal of Applied Physics 101.1, 2007, 014503, 10 pages.

Tai et al., "Threshold Voltage Modulation Technique using Fluorine Treatment through Atomic Layer Deposition TiN Suitable for Complementary Metal-Oxide-Semiconductor Devices," Jpn. J. Appl. Phys., vol. 47, No. 4, 2008, pp. 2345-2348.

Zhang et al., "High-k Metal Gate Fundamental Learning and Multi-V t Options for Stacked Nanosheet Gate-All-Around Transistor," 2017 IEEE International Electron Devices Meeting (IEDM), IEEE, 2017, 4 pages.

Ando et al., "Co-Integrated Channel and Gate Formation Scheme for Nanosheet Transistors Having Separately Tuned Threshold Voltages," U.S. Appl. No. 16/688,222, filed Nov. 19, 2019.

List of IBM Patents or Patent Applications Treated As Related; Date Filed: Nov. 19, 2019, 2 pages.

US 10,692,866 B2

CO-INTEGRATED CHANNEL AND GATE FORMATION SCHEME FOR NANOSHEET TRANSISTORS HAVING SEPARATELY TUNED THRESHOLD VOLTAGES

BACKGROUND

The present invention relates in general to fabrication methods and resulting structures for semiconductor devices. More specifically, the present invention relates to fabrication methods and resulting structures for channel and gate structures of nanosheet transistors having separately tuned threshold voltages.

In contemporary semiconductor device fabrication processes, a large number of semiconductor devices, such as n-type field effect transistors (nFETs) and p-type field effect transistors (pFETs), are fabricated on a single wafer. Non-planar transistor device architectures, such as nanosheet (or nanowire) transistors, can provide increased device density and increased performance over planar transistors. Nanosheet transistors, in contrast to conventional planar FETs, include a gate stack that wraps around the full perimeter of multiple nanosheet channel regions for improved control of channel current flow.

Like all transistors, a nanosheet transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor. As power and performance optimization have become increasingly important, the number of different threshold voltages available on a process have proliferated. Multiple threshold voltages allow designers to select the best option for each section of a design by trading-off power and performance.

SUMMARY

Embodiments of the invention are directed to a method of fabricating a semiconductor device. A non-limiting example of the method including performing first fabrication operations to form nanosheet field FET devices in a first region of a substrate. The first fabrication operations include forming a first channel nanosheet, forming a second channel nanosheet over the first channel nanosheet, forming a first gate structure around the first channel nanosheet, and forming a second gate structure around the second channel nanosheet, wherein an air gap is between the first gate structure and the second gate structure. A dopant is applied to the first gate structure and the second gate structure, wherein the dopant is configured to enter the air gap and penetrate into the first gate structure and the second gate structure from within the air gap.

Embodiments of the invention are directed to a configuration of nanosheet FET devices in a first region of a substrate. Each of the nanosheet FET devices in the first region includes a first channel nanosheet, a second channel nanosheet over the first channel nanosheet, a first gate structure around the first channel nanosheet, and a second gate structure around the second channel nanosheet, wherein the first gate structure and the second gate structure pinch off in a pinch off area between the first gate structure and the second gate structure. The first gate structure includes a doped region, and the second gate structure includes a doped region. At least a portion of the pinch off area is undoped.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 1A-15 depict various views of nanosheet-based structures after various fabrication operations for forming nanosheet FETs on the same substrate, wherein the nanosheet-based structures have channel and gate structures configured and arranged to provide separately tunable threshold voltages in accordance with aspects of the invention, in which:

FIG. 1A depicts a top-down view of a nanosheet-based structure after initial fabrication operations in accordance with embodiments of the invention;

FIG. 6 depicts a cross-sectional view of an example implementation of the nanosheet-based structure shown in FIG. 1C taken along line Y-Y';

FIG. 7 depicts a cross-sectional view of the nanosheet-based structure shown in FIG. 6 after various fabrication operations in accordance with embodiments of the invention, wherein the cross-sectional view shown in FIG. 7 is taken along line X-X';

FIG. 8 depicts a cross-sectional view of another example implementation of the nanosheet-based structure shown in FIG. 1C taken along line Y-Y';

FIG. 9 depicts a cross-sectional view of the nanosheet-based structure shown in FIG. 8 after various fabrication operations in accordance with embodiments of the invention, wherein the cross-sectional view shown in FIG. 9 is taken along line X-X';

FIGS. 10-12 depict cross-sectional views of the nanosheet-based structure shown in FIG. 9 after various fabrication operations to form gate structures configured and arranged to provide separately tunable threshold voltages in accordance with embodiments of the invention, in which:

FIG. 10 depicts a cross-sectional view of the nanosheet-based structure shown in FIG. 9 after fabrication operations in accordance embodiments of the invention;

FIG. 11 depicts a cross-sectional view of the nanosheet-based structure shown in FIG. 10 after fabrication operations in accordance embodiments of the invention; and FIG. 12 depicts a cross-sectional view of the nanosheet-based structure shown in FIG. 11 after fabrication operations in accordance embodiments of the invention; and FIGS. 13-15 depict cross-sectional views of the nanosheet-based structure shown in FIG. 9 after various fabrication operations to form gate structures configured and arranged to provide separately tunable threshold voltages in accordance with embodiments of the invention, in which:

FIG. 13 depicts a cross-sectional view of the nanosheet-based structure shown in FIG. 9 after fabrication operations in accordance embodiments of the invention;

FIG. 14 depicts a cross-sectional view of the nanosheet-based structure shown in FIG. 13 after fabrication operations in accordance embodiments of the invention; and FIG. 15 depicts a cross-sectional view of the nanosheet-based structure shown in FIG. 14 after fabrication operations in accordance embodiments of the invention.

DETAILED DESCRIPTION

Figure 1A:
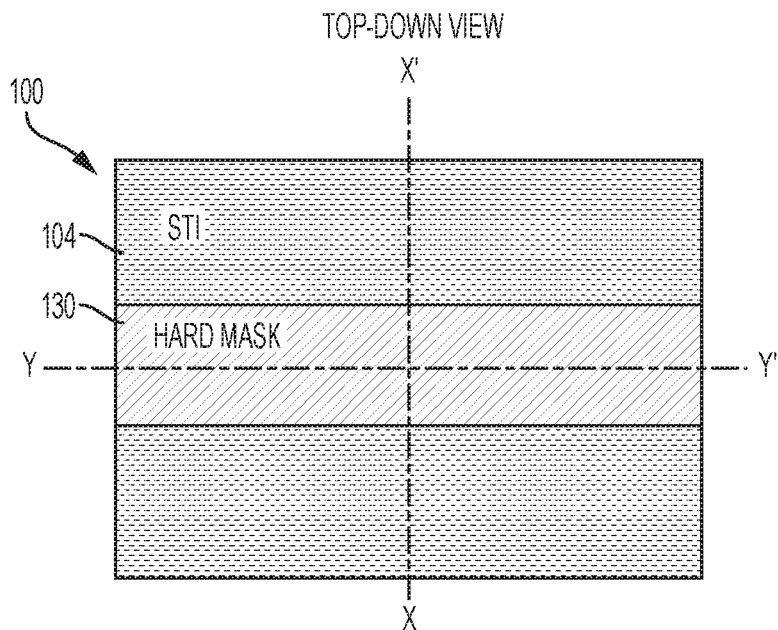

It is understood in advance that although this invention includes a detailed description of exemplary gate-all-around (GAA) nanosheet FET architectures having silicon (Si) channel nanosheets and SiGe sacrificial nanosheets, embodiments of the invention are not limited to the particular FET architectures or materials described in this specification. Rather, embodiments of the present invention are capable of being implemented in conjunction with any other type of nanosheet/nanowire FET architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Typical semiconductor devices are formed using active regions of a wafer. The active regions are defined by isolation regions used to separate and electrically isolate adjacent semiconductor devices. For example, in an IC having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

MOSFET-based ICs are fabricated using so-called complementary metal oxide semiconductor (CMOS) fabrication technologies. In general, CMOS is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a so-called gate-all-around (GAA) nanosheet FET is a known architecture for providing a relatively small FET footprint by forming the channel region as a series of nano sheets. In a known GAA configuration, a nanosheet-based FET includes a source region, a drain region and stacked nanosheet channels between the source and drain regions. The stacked nanosheet channels are spaced apart from one another, and a gate surrounds the spaced apart and stacked nanosheet channels to regulate electron flow through the nanosheet channels between the source and drain regions.

GAA nanosheet FETs can be fabricated by forming alternating layers of channel nanosheets and sacrificial nanosheets. The sacrificial nanosheets are released from the channel nanosheets before the FET device is finalized. For n-type FETs, the channel nanosheets are typically silicon (Si) and the sacrificial nanosheets are typically silicon germanium (SiGe). For p-type FETs, the channel nanosheets can be SiGe and the sacrificial nanosheets can be Si. In some implementations, the channel nanosheet of a p-type FET can be SiGe or Si, and the sacrificial nanosheets can be Si or SiGe. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling gate lengths down to seven (7) nanometer CMOS technology and below. The use of multiple layered SiGe/Si sacrificial/channel nanosheets (or Si/SiGe sacrificial/channel nanosheets) to form the channel regions in GAA FET semiconductor devices provides desirable device characteristics, including the introduction of strain at the interface between SiGe and Si.

As previously noted herein, the threshold voltage (Vt) of a MOSFET is the voltage that is required to turn the transistor on. As power and performance optimization have become increasingly important, the number of different threshold voltages available on a process have proliferated. Multiple threshold voltages allow designers to select the best option for each section of a design by trading-off power and performance. Vt is determined by several factors including the WF of the gate metal stack. It is generally desirable to provide different types of WFM in the gate electrode metal stacks, one for PFET transistors and one for the NFET transistors. The use of dual/multiple WFMs is part of optimizing the NFET and PFET threshold voltages.

In non-planar, fully depleted channel architectures (e.g., FinFETs, GAA nanosheet transistors, and the like), providing multiple work function metals in the gate stacks is indispensable to achieving CMOS technology with multiple threshold voltages to take advantage of higher mobility and smaller device variability due to an absence of channel doping. Known schemes for forming multiple work function gate structures require patterning steps after depositing the gate dielectric in order to pattern the work function setting metal or the dipole formation elements (e.g. La, Al). For nanosheet-based transistor devices, it is very challenging to perform such patterning steps after gate dielectric deposition because of the limited amount of available space between the channel nanosheets. With limited space between the channel nanosheets, the organic planarization layer (OPL) can pinch off in the limited space. It can be difficult to remove the pinched off OPL from the space between adjacent channel nanosheets.

Turning now to an overview of aspects of the invention, embodiments of the invention provide fabrication methods and resulting structures for providing channel and gate structures of nanosheet transistors. The channel and gate structures of a given nanosheet transistor can be tuned/controlled separately from other nanosheet transistors on the same substrate, thereby providing nanosheet-based structures having separately tuned/controlled threshold voltages. In embodiments of the invention, different groups or types of nanosheet transistors will be formed in different regions of the same substrate, and each such group/region can be provided with its own work function metal and associated threshold voltage. In at least one of the groups of nanosheet transistors, the gate metal deposition process according to aspects of the invention is configured to selectively deposit the gate metal over the channel nanosheets in a manner that leaves an air gap in the deposited gate metal that is between the channel nanosheets. In embodiments of the invention, the air gap extends along a width dimension of the channel nanosheet that the gate metal surrounds. The work function of the deposited gate metal is tuned by applying a doping process that introduces dopant(s) into the gate metal. In embodiments of the invention, the doping process includes exposing the deposited gate metal to a dopant carrying gas at a preselected time/duration/ and in a preselected ambient environment. The air gap creates additional surface areas of the gate metal, and these additional surface areas provide additional access points for the doping agent to drive dopants into the gate metal. In accordance with aspects of the invention, the threshold voltages of nanosheet transistors in this group can be tuned/controlled by tuning/controlling the type of gate metal, the type of dopant(s), the thickness of the deposited gate metal, the thickness of the air gap, and the temperature/duration/ambient of the doping process. In embodiments of the invention, this region of the substrate is referred to as an air-gap region.

In at least one of the groups/regions of nanosheet transistors, the gate metal deposition process according to aspects of the invention is configured to selectively deposit the gate metal over the channel nanosheets in a manner such that the deposited metal in the space between channel nanosheets is pinched off and gate metal substantially fills the space between channel nanosheets. In embodiments of the invention, the pinched off metal creates a pinch off region(s) that extends along a width dimension of the channel nanosheet that the gate metal surrounds. The work function of the deposited gate metal is tuned by applying a doping process that introduces dopant(s) into the gate metal. In embodiments of the invention, the doping process includes exposing the deposited gate metal to a dopant carrying gas at a preselected time/duration/ and in a preselected ambient environment. In comparison to the groups/regions in which an air-gap creates additional surface areas of the deposited gate metal, the groups/regions in which pinch off areas are created in the gate metal have fewer gate metal surface areas and fewer access points for the doping agent to drive dopants into the gate metal. In accordance with aspects of the invention, the threshold voltages of nanosheet transistors in this group can be tuned/controlled by tuning/controlling the type of gate metal, the type of dopant(s), the thickness of the deposited gate metal, the thickness of the pinch off area(s), and the temperature/duration/ambient of the doping process. In embodiments of the invention, this region of the substrate is referred to as a pinch off region.

In embodiments of the invention, the fabrication methodologies for forming different groups or types of nanosheet transistors in different regions of the same substrate are co-integrated, which means that many operations of the fabrication methodology are shared by the different group. In embodiments of the invention where the different regions include the above-described air-gap region and the above-described pinch off region, many of the fabrication processes are shared across air-gap region and the pinch off region. For example, in embodiments of the invention, the same process is used to deposit gate metal in the air-gap region and the pinch off region, which results in the gate metal in the air-gap region and the pinch off region having substantially the same thickness. Additionally, the same doping process (e.g., exposing the deposited gate metals to a dopant carrying gas at a preselected time/duration/ and in a preselected ambient environment) is applied to the air-gap region and the pinch off region. In embodiments of the invention where the gate metal, the gate metal deposition process, and the doping processes are the same in the air-gap region and the pinch-off region, the additional metal gate surfaces in the air-gap region result in more dopants in the air-gap region gate metal than in the pinch off region gate metal, which results in the air-gap region gate metal having a different threshold voltage than the pinch off region gate metal. In embodiments of the invention, the duration of the doping process is insufficient to drive dopants into the pinch off area of the gate metal. Accordingly, the pinch off area of the gate metal can remains substantially undoped. Thus, embodiments of the invention utilize fabrication process that achieve both the co-integration of fabrication processes across multiple substrate regions, as well as the tuning/controlling of threshold voltages across multiple substrate regions.

In embodiments of the invention, forming the air-gap region and the pinch off region using the above-described co-integrated fabrication processes is enabled by selecting the space between the channel nanosheets in the air-gap region to be greater than the space between the channel nanosheets in the pinch off region. In embodiments of the invention, the space between channel nanosheets in the air-gap region, the space between channel nanosheets in the pinch off region, and the duration of the gate metal deposition are selected such that applying the same gate metal deposition process to the air-gap region and the pinch off region pinches off the deposited gate metal in the pinch off region while an air-gap remains in the deposited gate metals in the air-gap region. By adjusting the so-called "suspension spacing" (i.e., the spacing between sheets—Tsus) in the air-gap region and the pinch off region, the work function metal will be pinched off in the pinch off region when the deposited gate metal thickness is greater than (Tsus−2*gate-dielectric)/2. By exploiting the gate metal pinch off condition, the gate metals in the air-gap region and the pinch off region can be selectively doped, thereby enabling selective tuning of the threshold voltages of nanosheet-based structures in the air-gap region separately from the threshold voltage of nanosheet-based structures in the pinch-off region.

In embodiments of the invention, the threshold voltage can be further controlled/tuned by controlling/tuning the gate metal material and the dopants. In embodiments of the invention, the gate metal material can be titanium nitride (TiN), and the dopants can be oxygen (O) or fluorine (F). In embodiments of the invention, the gate material can be tantalum carbide (TaC), and the dopants can be nitrogen (N).

Accordingly, using the channel formation and gate deposition processes according to aspects of the invention, there is no need to apply a patterning scheme to the gate metals in order to achieve the different gate metal work functions that are required in order to achieve the different threshold voltages.

Figure 1B:
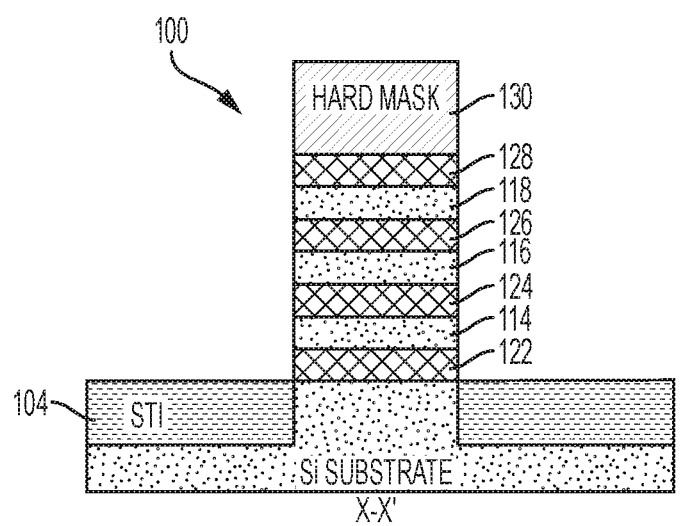
FIG. 1B depicts a cross-sectional view of the nanosheet-based structure shown in FIG. 1A taken along line X-X'.
Figure 1C:
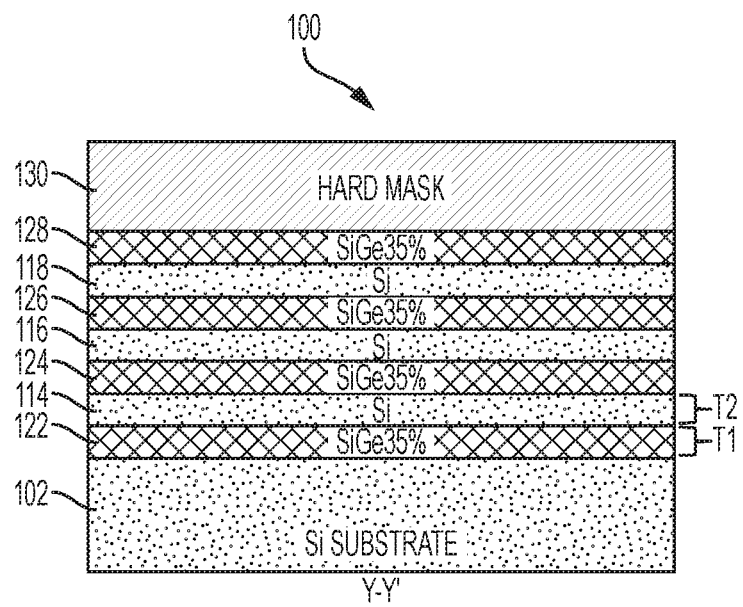
FIG. 1C depicts a cross-sectional view of the nanosheet-based structure shown in FIG. 1A taken along line Y-Y'.

Turning now to a more detailed description of fabrication operations according to aspects of the invention, FIGS. 1A-15 depict nanosheet-based structures 100, 100A, 100A', 100B, 100B' after various fabrication operations for forming nanosheet FETs on the same substrate 102. In embodiments of the invention, the nanosheet-based structures 100, 100A, 100A', 100B, 100B' have channel and gate structures configured and arranged to provide separately tunable threshold voltages in accordance with aspects of the invention. FIG. 1A depicts a top-down view of the nanosheet-based structure 100 after initial fabrication operations in accordance with aspects of the present invention. FIG. 1B depicts a cross-sectional view of the nanosheet-based structure 100 taken along line X-X' shown in FIG. 1A, and FIG. 1C depicts a cross-sectional view of the nanosheet-based structure 100 taken along line Y-Y' shown in FIG. 1A. As best shown in FIG. 1B, known fabrication operations have been used to fabricate the nanosheet-based structure 100 to include a substrate 102, shallow trench isolation (STI) regions 104 formed over the substrate 102, a fin-shaped elongated stack of alternating sacrificial nanosheets 122, 124, 126, 128 and channel nanosheets 114, 116, 118 formed over the substrate, and a hard mask 130 formed over the sacrificial channel nanosheet 128.

In embodiments of the invention, the structure 100 shown in FIG. 1B can be fabricated by growing alternating sacrificial layers and channel layer over the substrate 102. In embodiments of the invention, the alternating nanosheet layers depicted are formed by epitaxially growing one layer and then the next until the desired number and desired thicknesses of the nanosheet layers are achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

In embodiments of the invention, a patterned hard mask (not shown) is deposited over the alternating nanosheet layers. The pattern of the hard mask defines the footprints of the hard mask 130 and the fin-shaped elongated stack of alternating sacrificial nanosheets 122, 124, 126, 128 and channel nanosheets 114, 116, 118. An etch (e.g., an RIE) or a recess is applied to remove the portions of the alternating nanosheet layers that are not covered by the patterned hard mask, thereby forming the hard mask 130 and the fin-shaped elongated stack of alternating sacrificial nanosheets 122, 124, 126, 128 and channel nanosheets 114, 116, 118. The etch/recess also defines a trench (not shown) in which the STI regions 104 are formed. In embodiments of the invention, the substrate 102 is Si, the STI regions 104 are an oxide, the sacrificial nanosheets 122, 124, 126, 128 are SiGe, the channel nanosheets 114, 116, 118 are Si, and the hard mask 130 is a nitride. The SiGe sacrificial nanosheet layers 122, 124, 126, 128 can be SiGe 35%. The notation "SiGe 35%" is used to indicate that 35% of the SiGe material is Ge, and 75% of the SiGe material is Si. In accordance with aspects of the invention, the hard mask 130 will function as a hard mask or permanent dummy gate that will remain in the final nanosheet FET 100A (shown in FIGS. 11A-11C) having a gate structure configured and arranged to reduce parasitic gate capacitance in accordance with aspects of the invention.

Figure 2A:
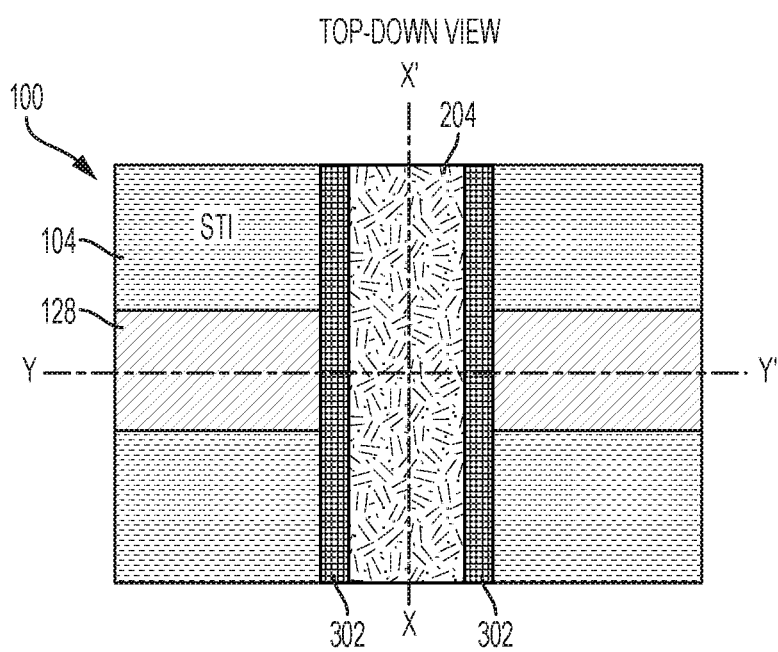
FIG. 2A depicts a top-down view of the nanosheet-based structure after fabrication operations in accordance with embodiments of the invention.
Figure 2B:
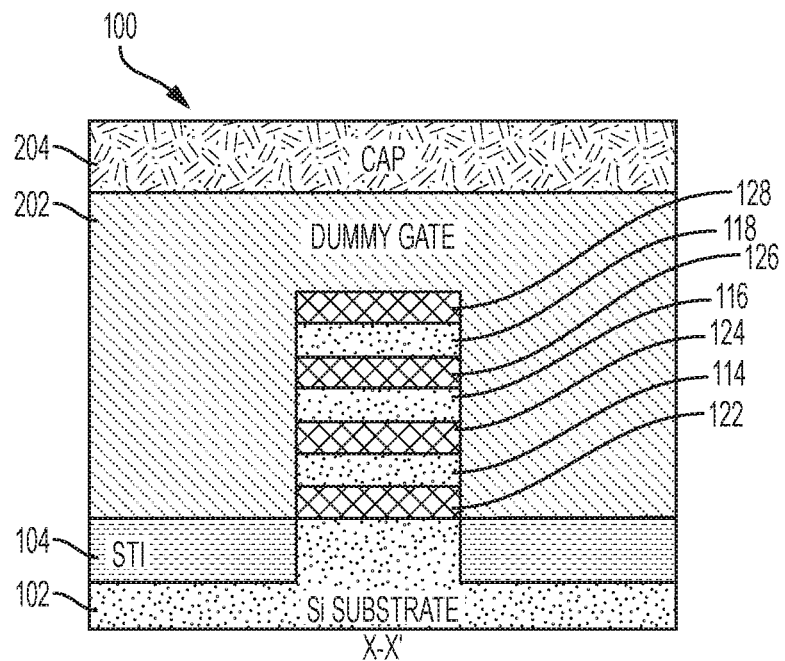
FIG. 2B depicts a cross-sectional view of the nanosheet-based structure shown in FIG. 2A taken along line X-X'.
Figure 2C:
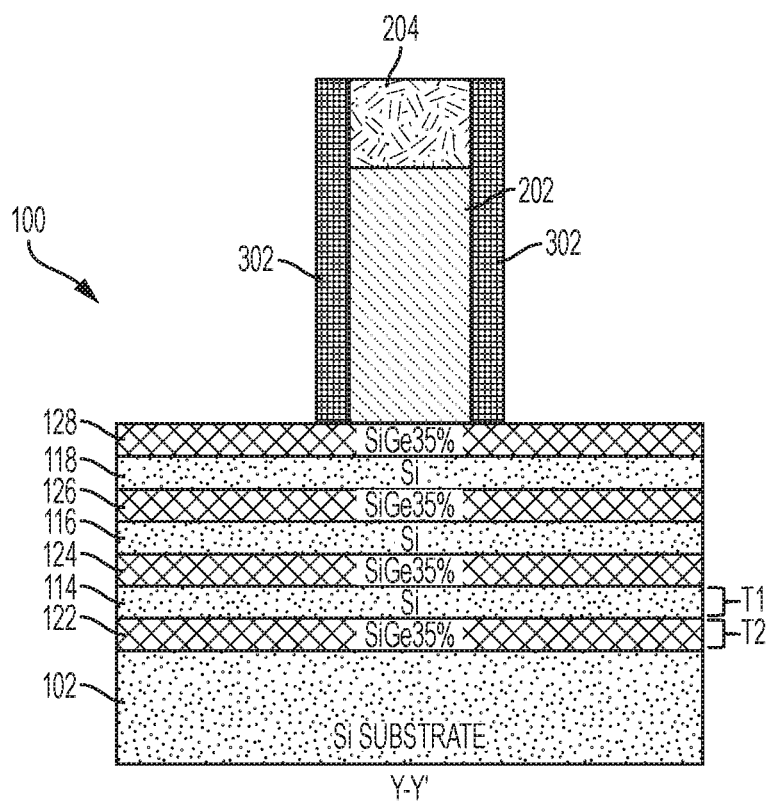
FIG. 2C depicts a cross-sectional view of the nanosheet-based structure shown in FIG. 2A taken along line Y-Y'.

FIG. 2A depicts a top-down view of the nanosheet-based structure 100 after fabrication operations in accordance with aspects of the present invention. FIG. 2B depicts a cross-sectional view of the nanosheet-based structure 100 taken along line X-X' shown in FIG. 2A, and FIG. 2C depicts a cross-sectional view of the nanosheet-based structure 100 taken along line Y-Y' shown in FIG. 2A. As best shown in FIG. 2B, known fabrication operations have been used to form a dummy gate 202 and a cap layer 204 that extend over and around the hard mask 130 and the fin-shaped elongated stack of alternating sacrificial nanosheets 122, 124, 126, 128 and channel nanosheets 114, 116, 118. The dummy gate 202 can be formed by depositing amorphous silicon (a-Si) over and around the hard mask 130 and the fin-shaped elongated stack of alternating sacrificial nanosheets 122, 124, 126, 128 and channel nanosheets 114, 116, 118. The a-Si is then planarized to a desired level. A hard mask layer (not shown) is deposited over the planarized a-Si and patterned to form the cap layer 204. In embodiments of the invention, the cap layer 204 can be formed from a nitride or an oxide layer. An etching process (e.g., an RIE) is applied to the a-Si to form the dummy gate 202.

As best shown in FIG. 2A and FIG. 2C, known semiconductor fabrication operations have been used to form offset gate spacers 302. In embodiments of the invention, the offset gate spacers 302 can be formed using a spacer pull down formation process. The offset gate spacers 302 can also be formed by a conformal deposition of a dielectric material (e.g., silicon oxide, silicon nitride, silicon oxynitride, SiBCN, SiOCN, SiOC, or any suitable combination of those materials) followed by a directional etch (e.g., RIE).

Figure 3A:
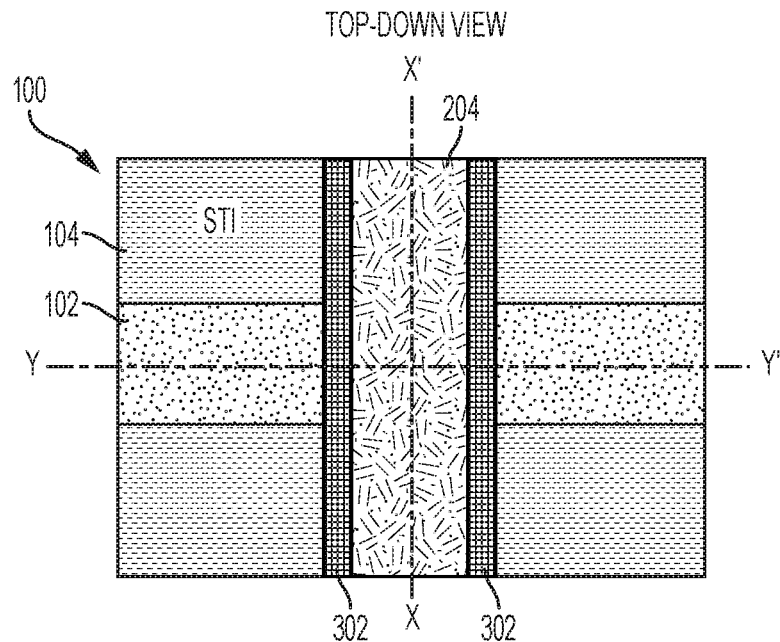
FIG. 3A depicts a top-down view of the nanosheet-based structure after fabrication operations in accordance with embodiments of the invention.
Figure 3B:
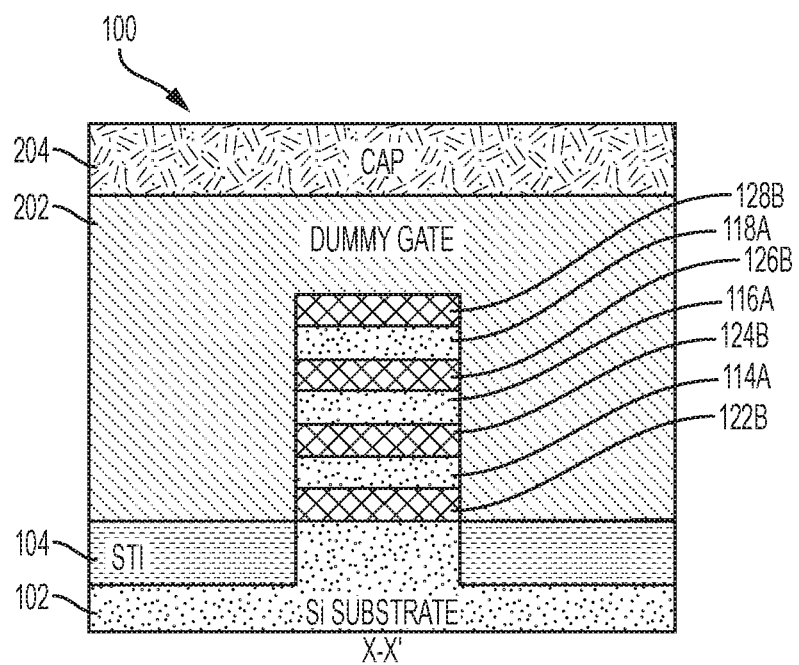
FIG. 3B depicts a cross-sectional view of the nanosheet-based structure shown in FIG. 3A taken along line X-X'.
Figure 3C:
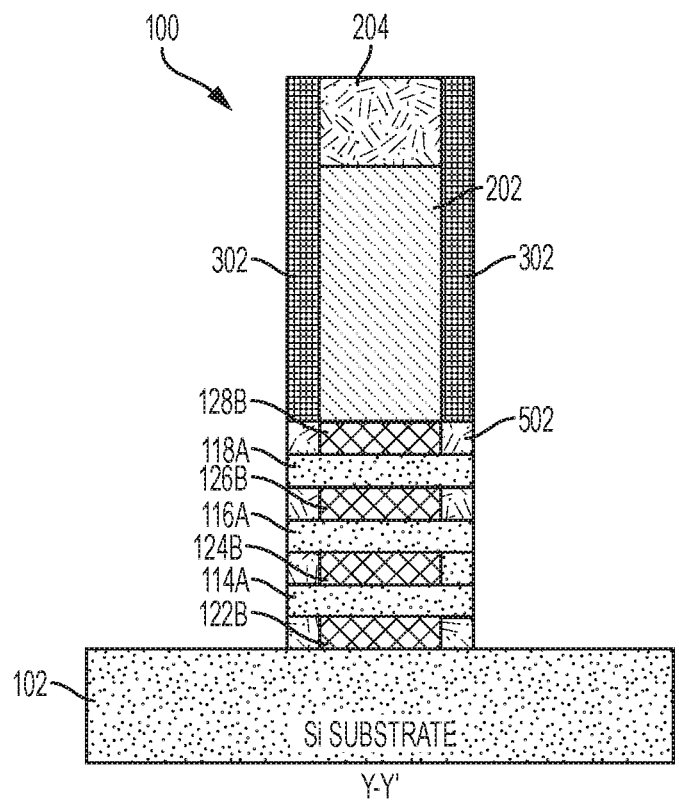
FIG. 3C depicts a cross-sectional view of the nanosheet-based structure shown in FIG. 3A taken along line Y-Y'.

FIG. 3A depicts a top-down view of the nanosheet-based structure 100 after fabrication operations in accordance with aspects of the present invention. FIG. 3B depicts a cross-sectional view of the nanosheet-based structure 100 taken along line X-X' shown in FIG. 3A, and FIG. 3C depicts a cross-sectional view of the nanosheet-based structure 100 taken along line Y-Y' shown in FIG. 3A. As best shown in FIG. 3A and FIG. 3C, known semiconductor fabrication operations (e.g., a recess or an etch) have been applied to the fin-shaped elongated stack of alternating sacrificial nanosheets 122, 124, 126, 128 and channel nanosheets 114, 116, 118 (shown in FIGS. 2A, 2B, and 2C) to form a column-shaped stack of alternating sacrificial nanosheets 122B, 124B, 126B, 128B and channel nanosheets 114A, 116A, 118A. The offset gate spacers 302 define a portion of the footprint of the column-shaped stack of alternating sacrificial nanosheets 122B, 124B, 126B, 128B and channel nanosheets 114A, 116A, 118A.

As best shown in FIG. 3C, known semiconductor fabrication operations have been used to partially remove end regions of the sacrificial nanosheets 122B, 124B, 126B, 128B. For example, the end regions of the sacrificial nanosheets 122B, 124B, 126B, 128B can be removed using a so-called "pull-back" process to pull the sacrificial nanosheets 122B, 124B, 126B, 128B back an initial pull-back distance such that their end regions terminate underneath the offset gate spacers 302. In embodiments of the invention, the pull-back process includes a hydrogen chloride (HCL) gas isotropic etch process, which etches the sacrificial nanosheet material (e.g., SiGe) without attacking the channel nanosheet material (e.g., Si). Known semiconductor fabrication processes are then used to form inner spacers 502 in the end regions of the sacrificial nanosheet regions 122B, 124B, 126B, 128B. In embodiments of the invention, the inner spacers 502 can be formed conformally by CVD, or by monolayer doping (MLD) of nitride followed by spacer RIE. The inner spacers 502 can be formed from a nitride containing material (e.g., silicon nitride (SiN)), which prevents excess gauging during subsequent RIE processes (e.g., sacrificial nanosheet removal) that are applied during the semiconductor device fabrication process.

Figure 4A:
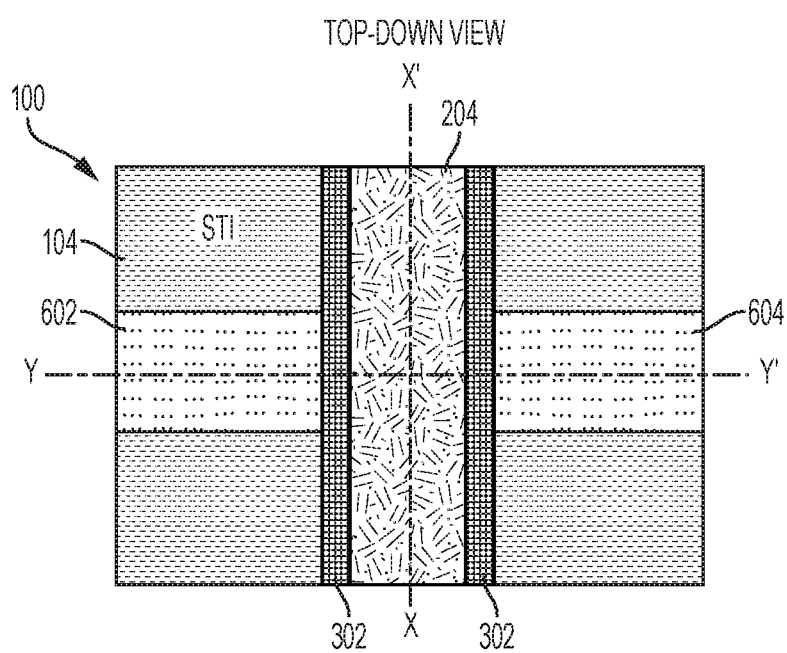
FIG. 4A depicts a top-down view of the nanosheet-based structure after fabrication operations in accordance with embodiments of the invention.
Figure 4B:
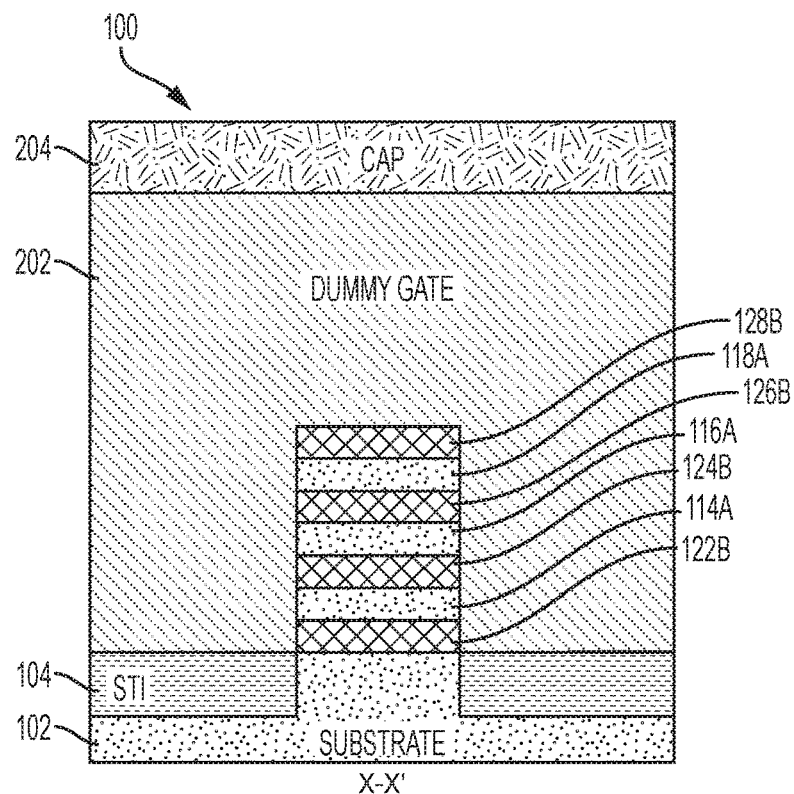
FIG. 4B depicts a cross-sectional view of the nanosheet-based structure shown in FIG. 4A taken along line X-X'.
Figure 4C:
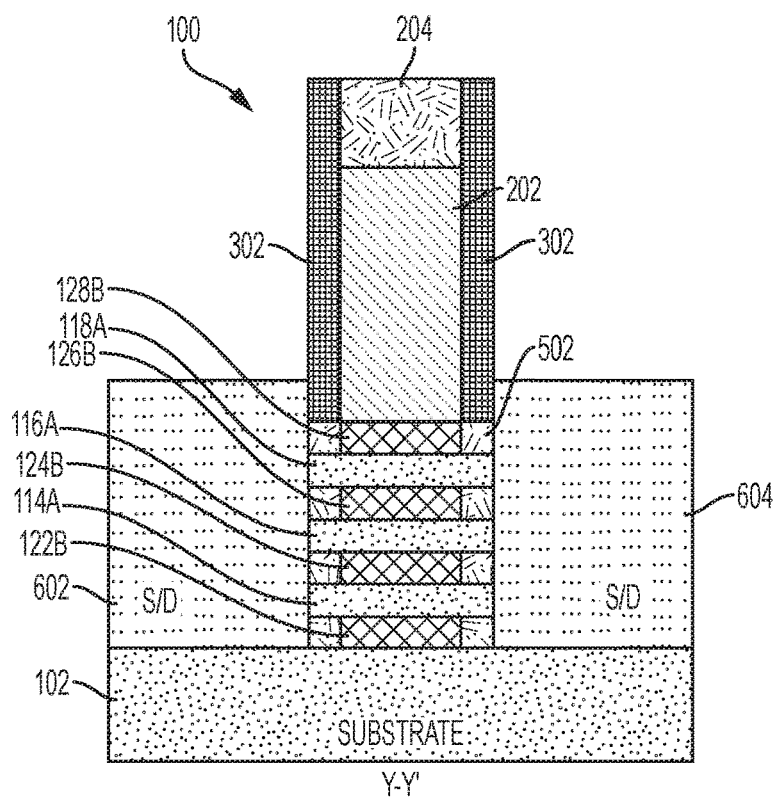
FIG. 4C depicts a cross-sectional view of the nanosheet-based structure shown in FIG. 4A taken along line Y-Y'.

FIG. 4A depicts a top-down view of the nanosheet-based structure 100 after fabrication operations in accordance with aspects of the present invention. FIG. 4B depicts a cross-sectional view of the nanosheet-based structure 100 taken along line X-X' shown in FIG. 4A, and FIG. 4C depicts a cross-sectional view of the nanosheet-based structure 100 taken along line Y-Y' shown in FIG. 4A. As best shown in FIG. 4C, known semiconductor fabrication operations have been used to form raised S/D regions 602, 604. In embodiments of the invention, the raised S/D regions 602, 604 are formed using an epitaxial layer growth process on the exposed ends of the channel nanosheets 114A, 116A, 118A. In some embodiments of the invention, the raised S/D regions 602, 604 can also be grown from exposed surfaces of the substrate 102 where the substrate is also a single crystalline material (e.g., a single crystalline silicon). In-situ doping (ISD) is applied to dope the S/D regions 602, 604, thereby creating the necessary junctions in the nanosheet-based structure 100 that will allow it to function as a nanosheet FET (not shown). Virtually all semiconductor transistors are based on the formation of junctions. Junctions are capable of both blocking current and allowing it to flow, depending on an applied bias. Junctions are typically formed by placing two semiconductor regions with opposite polarities into contact with one another. The most common junction is the p-n junction, which consists of a contact between a p-type piece of silicon, rich in holes, and an n-type piece of silicon, rich in electrons. N-type and p-type FETs are formed by implanting different types of dopants to selected regions of the device to form the necessary junction(s). N-type devices can be formed by implanting arsenic (As) or phosphorous (P), and p-type devices can be formed by implanting boron (B).

Figure 5A:
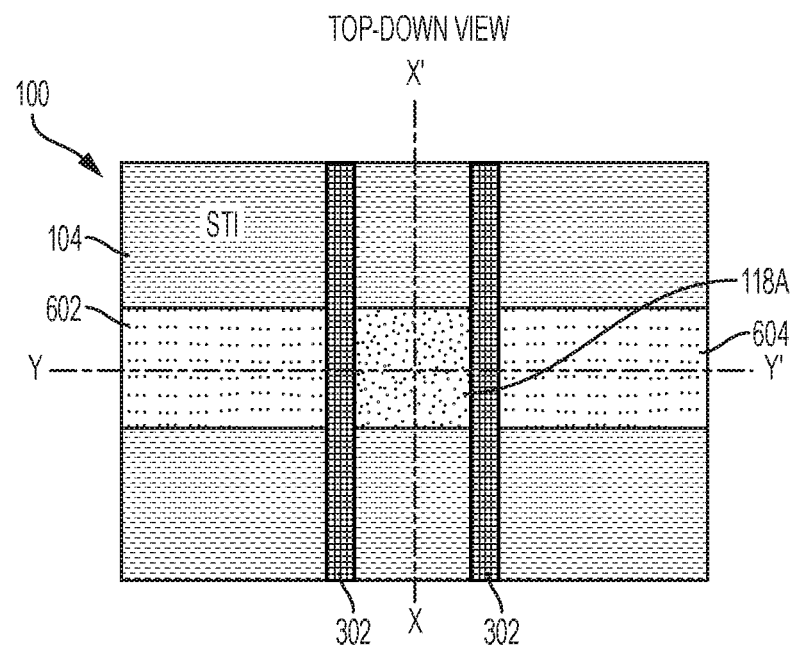
FIG. 5A depicts a top-down view of the nanosheet-based structure after fabrication operations in accordance with embodiments of the invention.
Figure 5B:
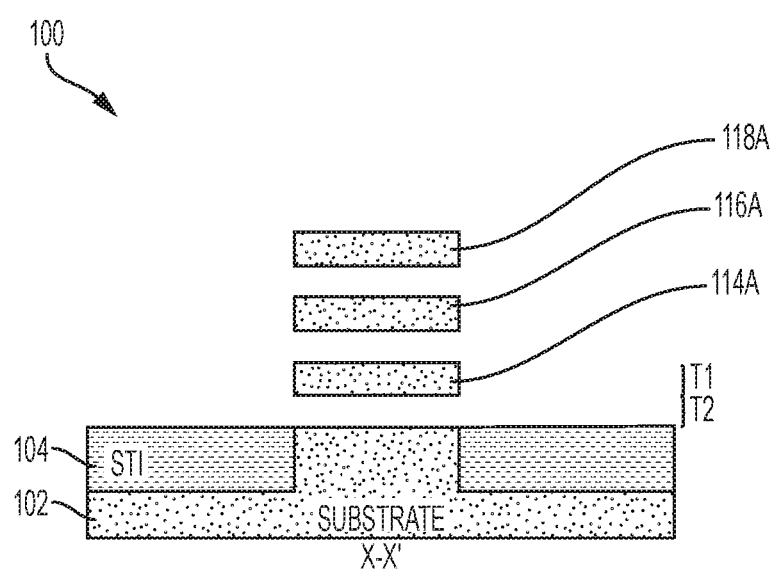
FIG. 5B depicts a cross-sectional view of the nanosheet-based structure shown in FIG. 5A taken along line X-X'.
Figure 5C:
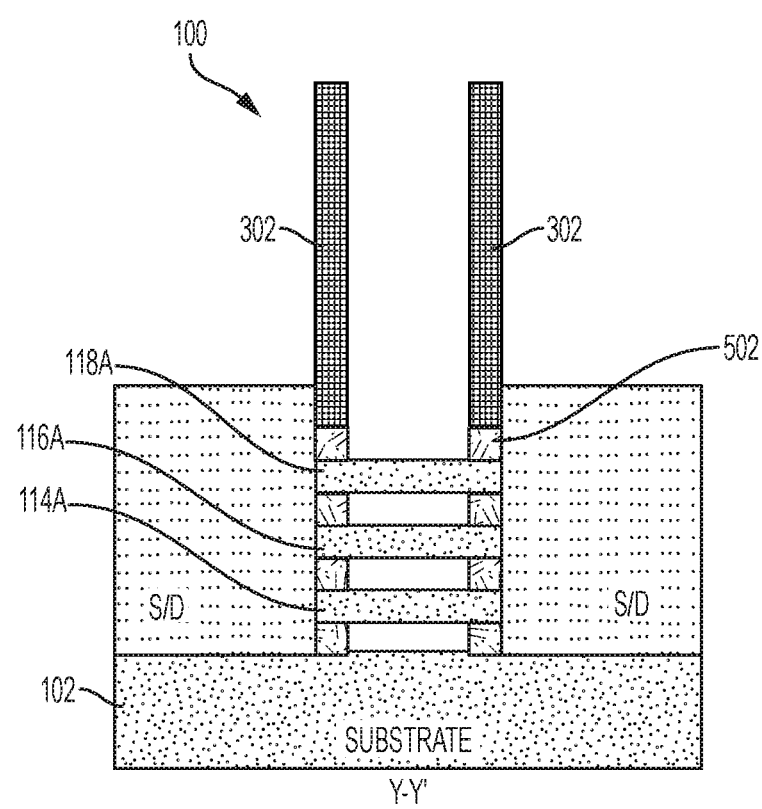
FIG. 5C depicts a cross-sectional view of the nanosheet-based structure shown in FIG. 5A taken along line Y-Y'.

FIG. 5A depicts a top-down view of the nanosheet-based structure 100 after fabrication operations in accordance with aspects of the present invention. FIG. 5B depicts a cross-sectional view of the nanosheet-based structure 100 taken along line X-X' shown in FIG. 5A, and FIG. 5C depicts a cross-sectional view of the nanosheet-based structure 100 taken along line Y-Y' shown in FIG. 5A. As best shown in FIG. 5B and FIG. 5C, known semiconductor fabrication operations have been used to remove the dummy gate 202 and the cap layer 204. In embodiments of the invention, the dummy gate 202 and the cap layer 204 can be removed using, for example, a known etching process, e.g., RIE or chemical oxide removal (COR). Additionally, known semiconductor fabrication operations have been used to remove the sacrificial nanosheet regions 122B, 124B, 126B, 128B (shown in FIG. 4C). In embodiments of the invention, the sacrificial nanosheet regions 122B, 124B, 126B, 128B can be removed by applying a selective etch (e.g., a hydrochloric acid (HCl)). In general, after the fabrication operations shown in FIGS. 5A, 5B, and 5C, the nanosheet-based structure 100 is now ready for the application of fabrication processes to replace the removed dummy gate 202 and cap layer 204 (shown in FIGS. 4A, 4B, and 4C) with a multi-segmented gate stack structure, which can include a relatively thin (e.g., from about 0.1 nm to about 2 nm) gate dielectric around the channel nanosheets 114A, 116A, 118A, a work function metal around the gate dielectric and the channel nanosheets 114A, 116A, 118A, and a primary metal region above the topmost channel nanosheet 118A between the gate spacer 302.

FIGS. 1A-5C depict fabrication operations for forming a single nanosheet-based structure 100. In embodiments of the invention, multiple instances of the nanosheet-based structure 100 are formed on the substrate 102. Additionally, regions (e.g., regions 650, 670 shown in FIG. 6) of nanosheet-based structures 100 can be formed on the substrate 102, and each region can be designed such that the nanosheet-based structures 100 in a given region (e.g., region 650) can be provided with work function gate metals and a threshold voltage that is different from the work function gate metals and the threshold voltage of another region (e.g., region 670).

Figure 6:
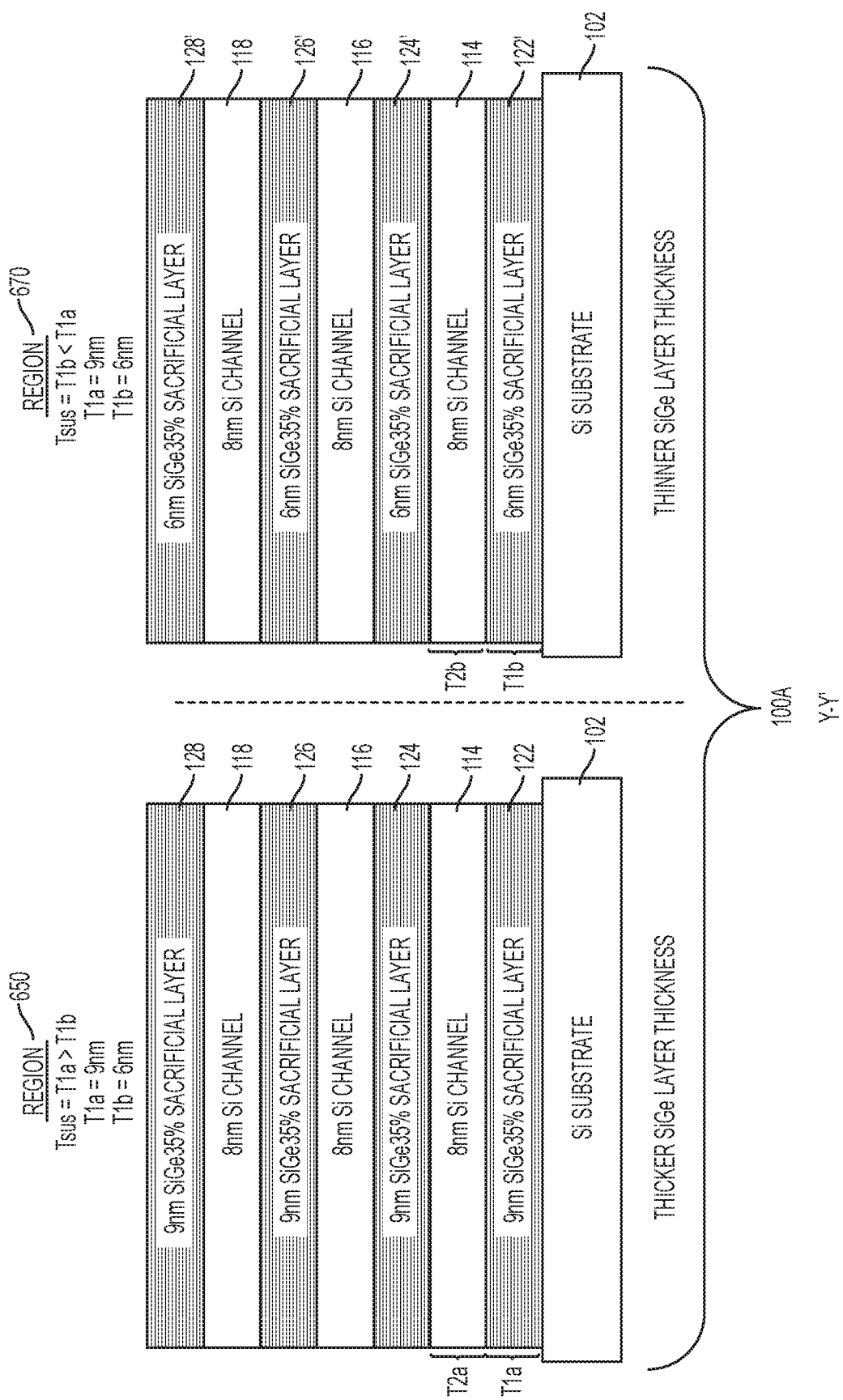
Figure 7:
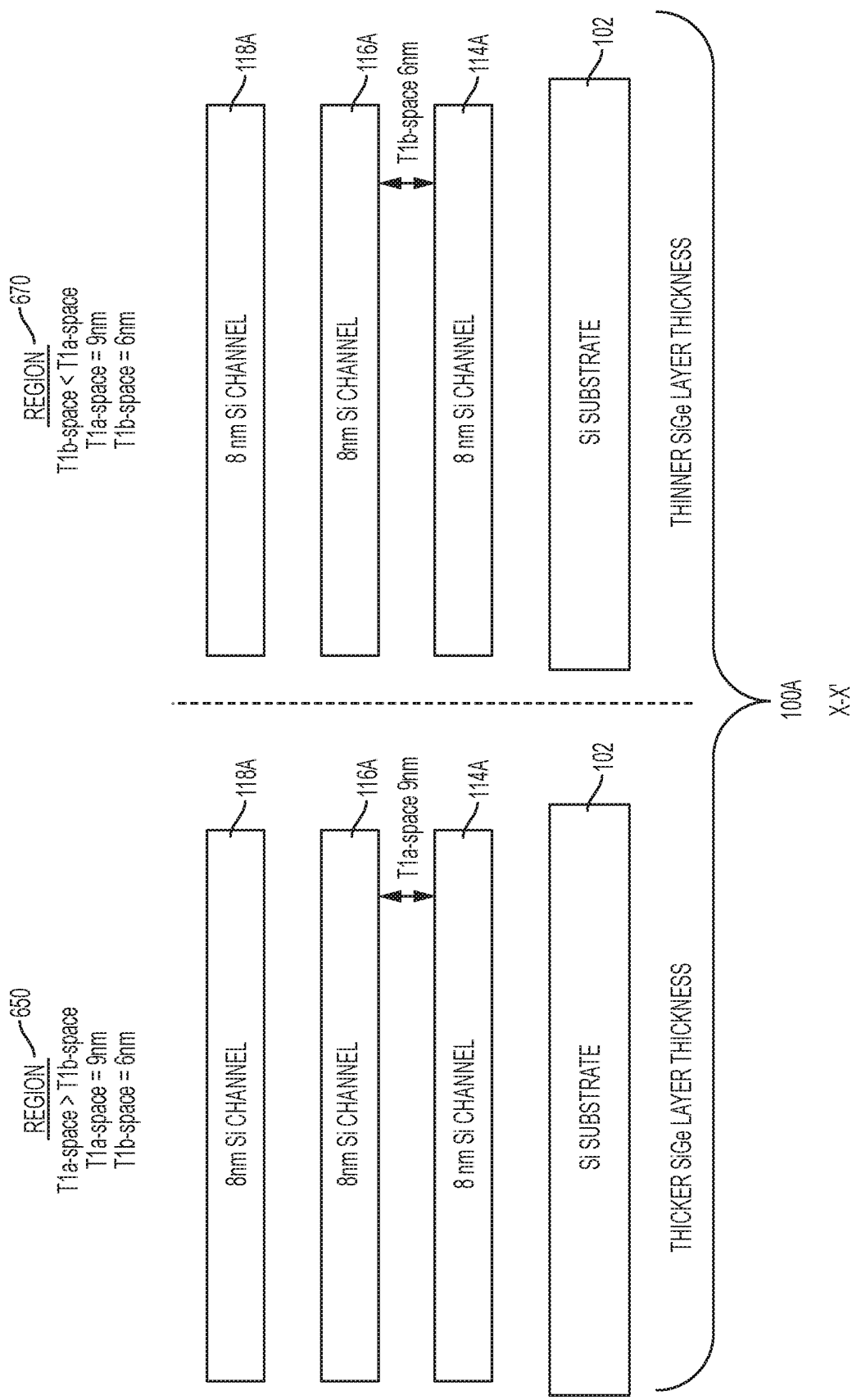

FIGS. 6 and 7 depict fabrication operations in accordance with aspects of the invention that can be used to create regions 650 and 670 in the substrate 102, wherein the space between channel nanosheets in region 650 is different than the space between channel nanosheets in region 670. In accordance with aspects of the invention, FIG. 6 depicts a semiconductor structure 100A after the fabrication operations depicted in FIGS. 1A-1C have been applied to form semiconductor structures in regions 650 and 670 of the substrate 102. More specifically, the semiconductor structure 100A is a specific example implementation of the semiconductor structure 100 shown in FIG. 1C and taken along line Y-Y' (as shown, for example, in FIG. 1A). The materials, material concentration percentages, and specific thickness dimensions depicted in FIG. 6 are provided to better illustrate aspects of the invention, and it should be understood that the scope of the invention is not limited to the materials, material concentration percentages, and specific thickness dimensions materials depicted in the examples shown in FIG. 6 or in any other example illustrated and described herein.

As shown in FIG. 6, the thickness dimension T1$a$ of each sacrificial layer 122, 124, 126, 128 is less than the thickness dimension T1$b$ of each sacrificial layer 122', 124', 126', 128' in region 670.

FIG. 7 depicts the semiconductor structure 100A after the fabrication operations depicted in FIGS. 2A-5C have been applied thereto. The nanosheet-based structure 100A shown in FIG. 7 corresponds to the nanosheet-based structure 100 shown in FIG. 5B and taken along line X-X' shown in FIG. 5A. For ease of illustration and explanation, the nanosheet-based structure 100A focuses on the channel nanosheet layers 114A, 116A, 118A in regions 650, 670 and does not depict the STI regions 104 and the offset gate spacers 302, although it is understood that, in practice, these elements are present. At the fabrication stage shown in FIG. 7, the sacrificial layers 122, 124, 126, 128 in region 650 have been removed, and the sacrificial layers 122', 124', 126', 128' in region 670 have been removed. Because T1a is greater than T1b, Tsus (i.e., the suspension thickness between the channel layers 114A, 116A, 118A suspended between the S/D regions 602, 604 shown in FIG. 5C), is larger in region 650 than in region 670.

Figure 8:
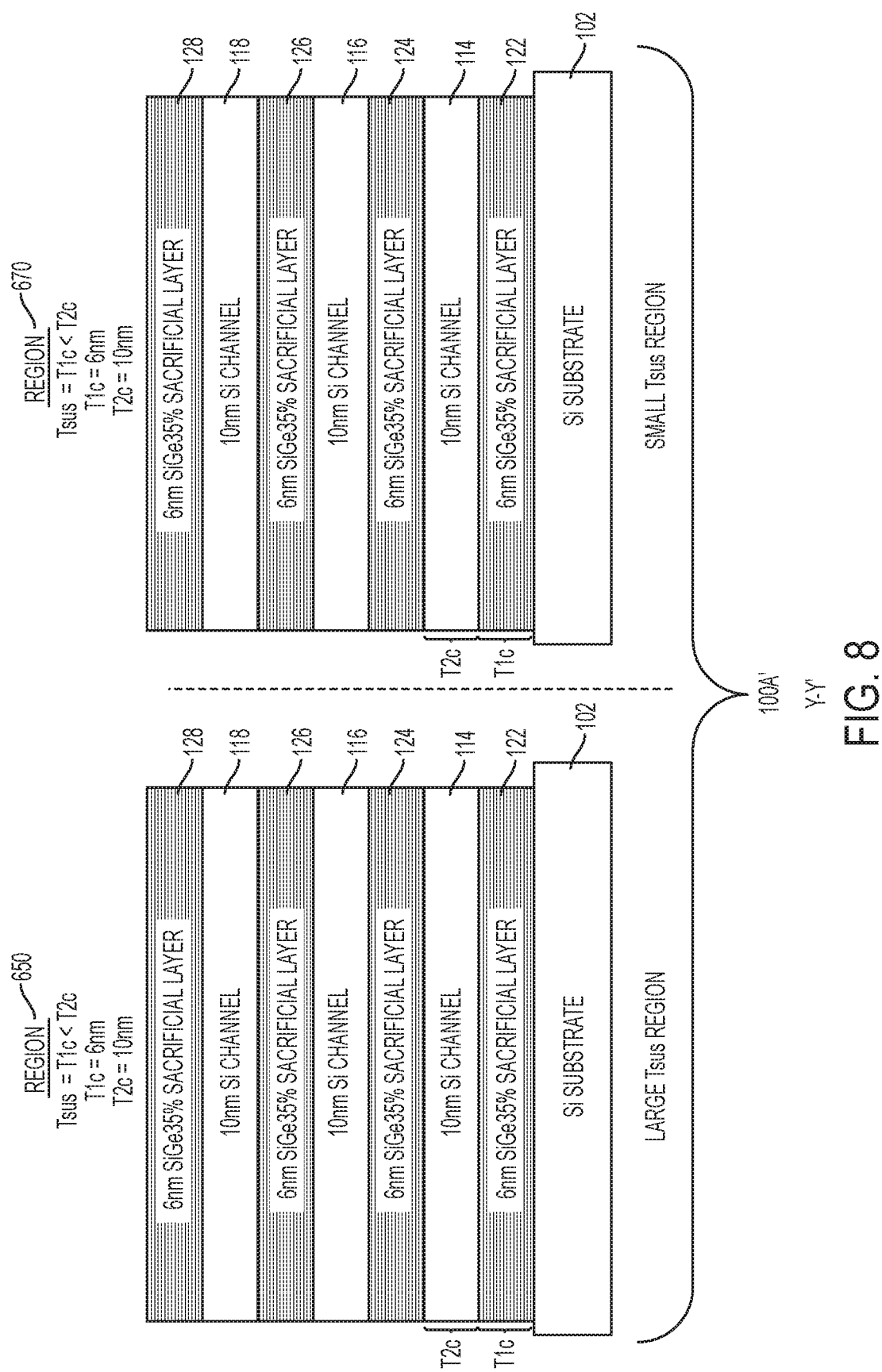

Similar to FIGS. 6 and 7, FIGS. 8 and 9 depict fabrication operations in accordance with aspects of the invention that can be used to create regions 650 and 670 in the substrate 102, wherein the space between channel nanosheets in region 650 is different than the space between channel nanosheets in region 670. In accordance with aspects of the invention, FIG. 8 depicts a semiconductor structure 100A' after the fabrication operations depicted in FIGS. 1A-1C have been applied to form semiconductor structures in regions 650 and 670 of the substrate 102. More specifically, the semiconductor structure 100A' is a specific example implementation of the semiconductor structure 100 shown in FIG. 1C and taken along line Y-Y' (as shown, for example, in FIG. 1A). The materials, material concentration percentages, and specific thickness dimensions depicted in FIG. 8 are provided to better illustrate aspects of the invention, and it should be understood that the scope of the invention is not limited to the materials, material concentration percentages, and specific thickness dimensions materials depicted in the examples shown in FIG. 8 or in any other example illustrated and described herein.

At the fabrication stage shown in FIG. 8, regions 650, 670 are identical to one another and to the semiconductor structure 100A (shown in FIGS. 6 and 7) except that the channel layers 114, 116, 118 in each region 650 670 shown in FIG. 8 are thicker than the channel layers 114, 116, 118 shown in FIGS. 6 and 7.

Figure 9:
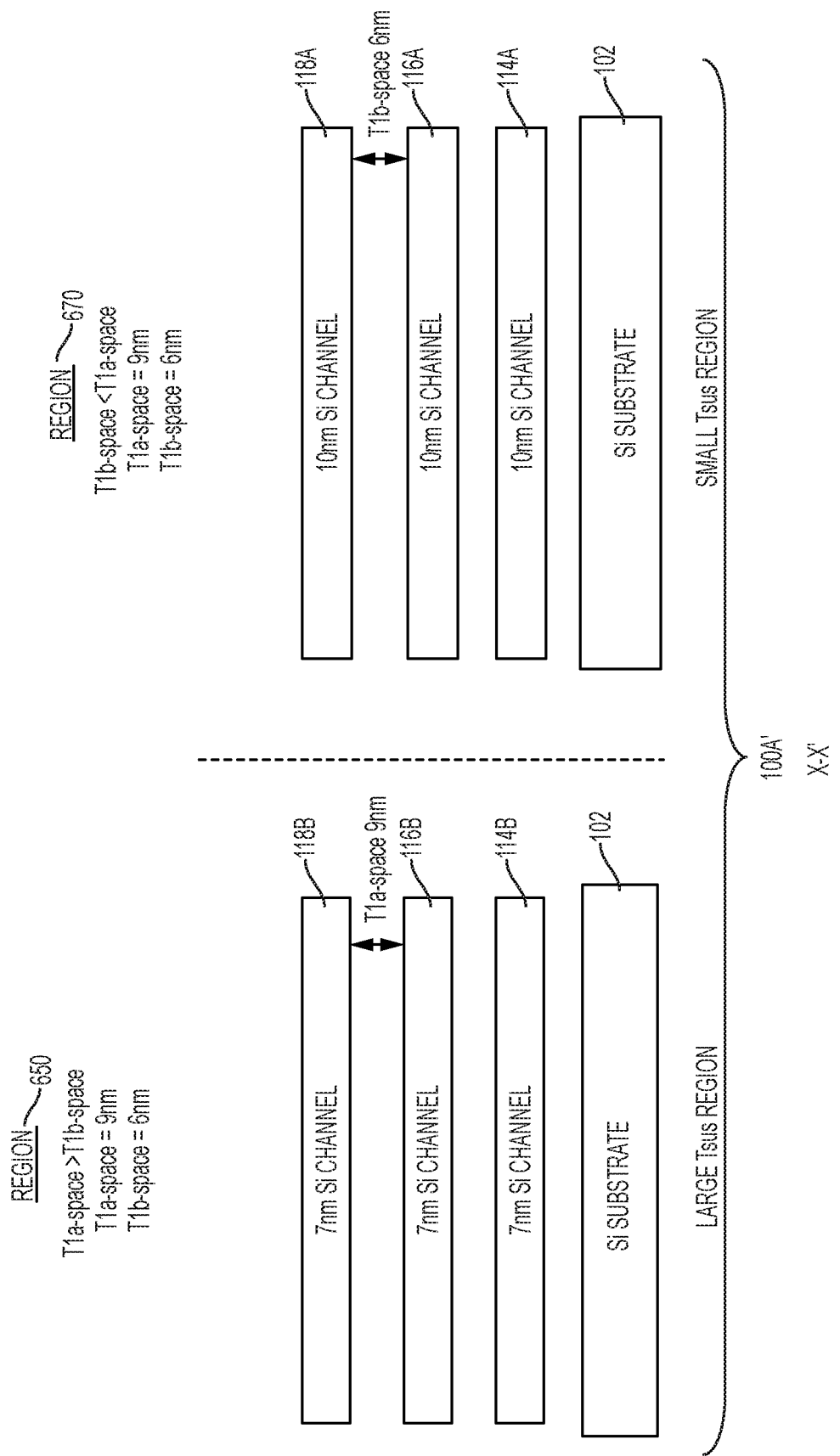

FIG. 9 depicts the semiconductor structure 100A' after the fabrication operations depicted in FIGS. 2A-5C have been applied thereto. The nanosheet-based structure 100A' shown in FIG. 9 corresponds to the nanosheet-based structure 100 shown in FIG. 5B and taken along line X-X' shown in FIG. 5A. For ease of illustration and explanation, the nanosheet-based structure 100A' focuses on the channel nanosheet layers 114A, 116A, 118A, 114B, 116B, 118B and does not depict the STI regions 104 and the offset gate spacers 302, although it is understood that, in practice, these elements are present. In accordance with embodiments of the invention, known semiconductor fabrication operations have been used to thin the channel layers in region 650, thereby creating the channel layers 114B, 116B, 118B in region 650 shown in FIG. 9. Accordingly, FIGS. 8 and 9 provide an alternative method of forming the T1a-space in region 650 that is greater than a T1b-space in region 670.

Figure 10:
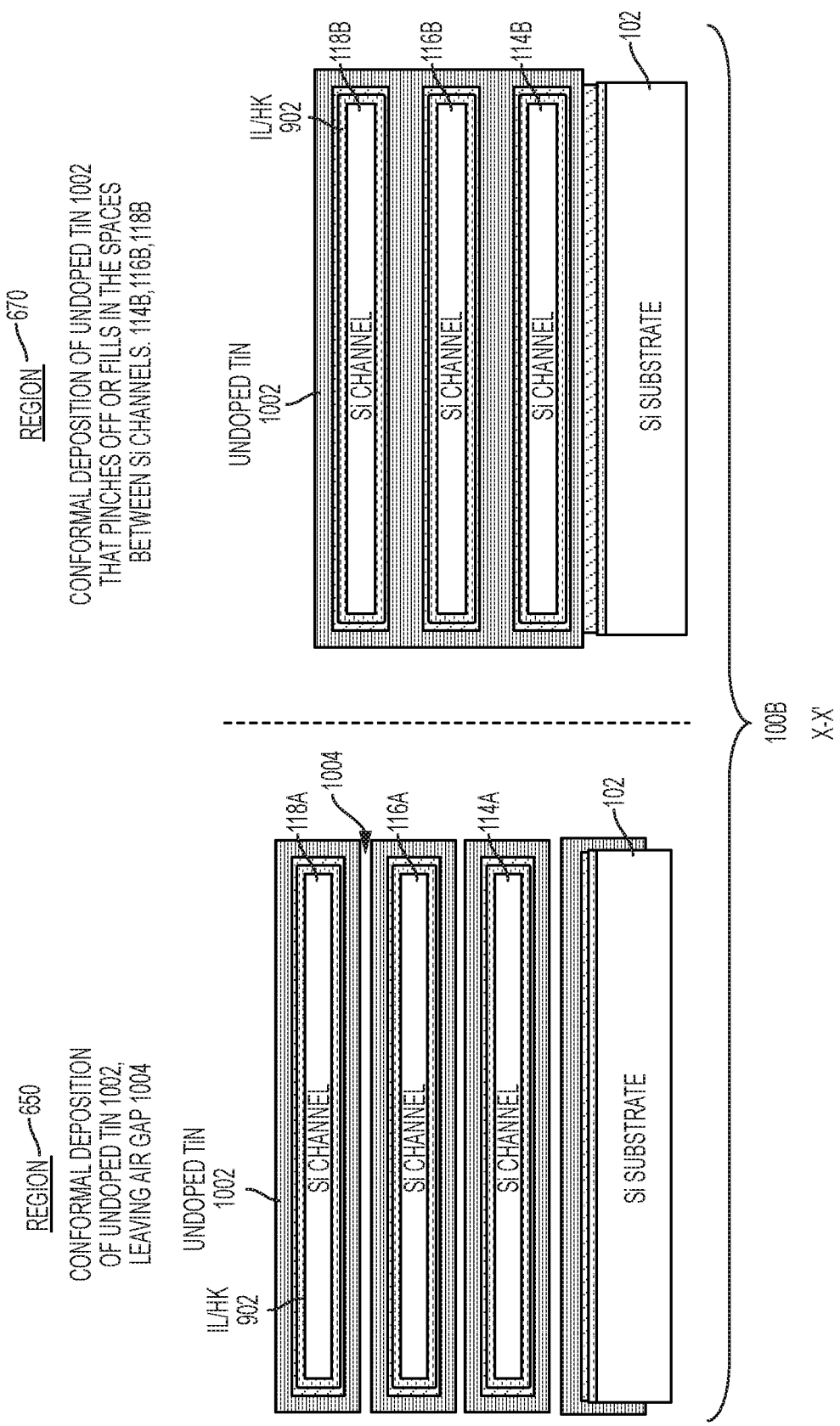
Figure 11:
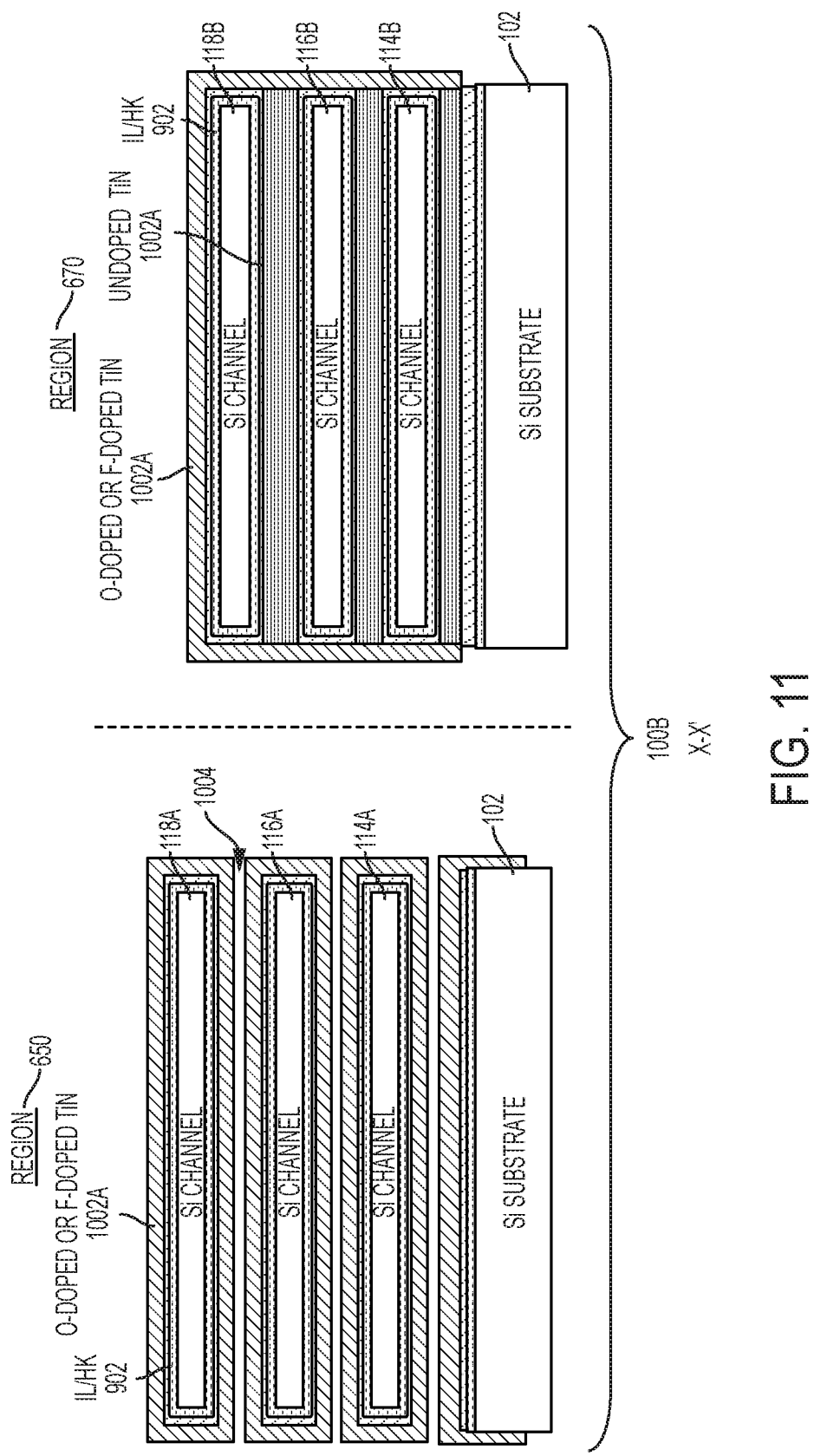
Figure 12:
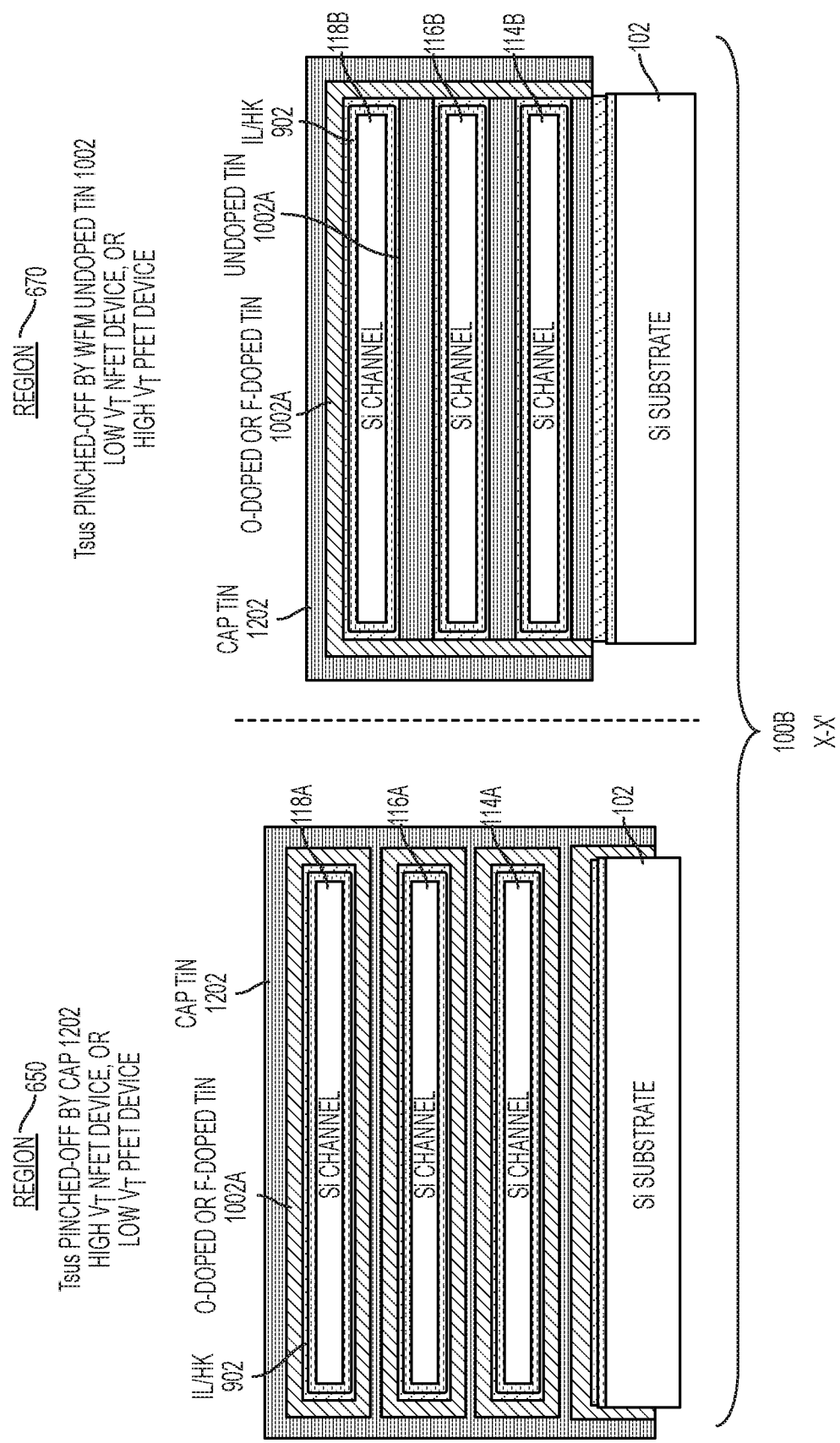

FIGS. 10-12 depict cross-sectional views (taken along line X'X') of a nanosheet-based structure 100B, which is the nanosheet-based structure 100A' shown in FIG. 9 after various fabrication operations to form gate structures configured and arranged to provide separately tunable threshold voltages in region 650 and region 670 in accordance with embodiments of the invention. In FIG. 10, known semiconductor fabrication operations have been used to a conformal and relatively thin gate dielectric 902 has been deposited around each channel nanosheet 114A, 116A, 118A in region 650 and each channel nanosheet 114B, 116B, 118B in region 670. In embodiments of the invention, the gate dielectric 902 is relatively thin (e.g., about 1.75 nm). In embodiments of the invention, the relatively thin gate dielectric layer 902 can be formed from one or more gate dielectric films such as thermally oxidized Si or SiGe, thermally oxidized and nitrided Si or SiGe, an interlayer dielectric (ILD) material and a high-k dielectric. The gate dielectric films can be a dielectric material having a dielectric constant greater than, for example, 3.9, 7.0, or 10.0. Non-limiting examples of suitable materials for the high-k dielectric films include oxides, nitrides, oxynitrides, silicates (e.g., metal silicates), aluminates, titanates, nitrides, or any combination thereof. Examples of high-k materials with a dielectric constant greater than 7.0 include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The gate dielectric films can further include dopants such as, for example, lanthanum and aluminum. The gate dielectric films can be formed by suitable deposition processes, for example, CVD, PECVD, atomic layer deposition (ALD), evaporation, physical vapor deposition (PVD), chemical solution deposition, or other like processes.

As also shown in FIG. 10, known semiconductor fabrication operations have been used to conformally deposit an undoped work function metal (WFM) 1002 around the gate dielectric 902 and the channel layers 114A, 116A, 118A in region 650 and around the gate dielectric 902 and the channel layers 114B, 116B, 118B in region 670. In embodiments of the invention, the undoped WFM 1002 is TiN. In embodiments of the invention, the conformal deposition of the WFM 1002 is performed by an ALD process. In embodiments of the invention, the thickness of the undoped WFM 1002 is sufficient to leaves air gaps 1004 between each of the channel nanosheets 114A, 116A, 118A in region 650. Because the T1a-space (i.e., the space between the channel nanosheets 114A, 116A, 118A in region 650) is greater than the T1b-space (i.e., the space between the channel nanosheets 114B, 116B, 118B in region 670), the thickness of the undoped WFM 1002 is sufficient to pinch off in the space between each of the channel nanosheets 114B, 116B, 118B in region 670.

In FIG. 11, the work function of the deposited undoped WFM 1002 is tuned by applying a doping process that introduces dopant(s) into the WFM 1002. In embodiments of the invention, the doping process includes exposing the deposited WFM 1002 in both regions 650, 670 to a dopant carrying gas at a preselected time/duration/ and in a preselected ambient environment. For example, the temperature can be from about 350 Celsius to about 450 Celsius, the dopant can be oxygen (O), the dopant carrying gas can include 02, and the ambient can be $N_2$. In embodiments of the invention, the dopant can be fluorine (F), the dopant carrying gas can be an F-containing gas (e.g., $WF_6$, $CF_4$, $NF_3$, and the like), and the ambient can be $N_2$. In accordance with aspects of the invention, in region 650, the air gap 1004 creates additional surface areas of the WFM 1002, and these additional surface areas provide additional access points for the doping agent to drive dopants into the WFM 1002 to create doped WFM 1002A in region 650. In accordance with aspects of the invention, the threshold voltages of nanosheet transistors formed from the nanosheet-based structure 100B in region 650 can be tuned/controlled by tuning/controlling the type of gate metal used to form the WFM 1002, the type of dopant(s) used to dope the WFM 1002, the thickness of the WFM 1002, the thickness/length of the air gap 1004, and the temperature/duration/ambient of the doping process (depicted in FIG. 11). In embodiments of the invention, region 650 of the substrate 102 can be referred to as an air-gap region 650.

In embodiments of the invention, when the above-described doping process is applied, the duration/temperature/time of the doping process is only sufficient to dope a portion of the WFM 1002. Accordingly, after application of the above-described doping process in region 670, WFM 1002A is formed in region 670, but an area of the undoped WFM 1002A remains. This area of undoped WFM 1002A is referred to herein as a pinch off area 1002A. In accordance with aspects of the invention, the threshold voltages of nanosheet transistors formed from the nanosheet-based structure 100B in region 670 can be tuned/controlled by tuning/controlling the type of gate metal used to form the WFM 1002, the type of dopant(s) used to dope the WFM 1002, the thickness of the WFM 1002, the thickness/length of the pinch off area 1002A, and the temperature/duration/ambient of the doping process (depicted in FIG. 11). In embodiments of the invention, region 670 of the substrate 102 can be referred to as a pinch off region 670.

In FIG. 12, a cap 1202 is conformally deposited in region 650 and 670. In embodiments of the invention, the cap layer 1202 can be formed from a nitride or an oxide layer. In region 650, the cap material (e.g., TiN) that forms the cap 1202 pinches off in the air gap 1004 (shown in FIG. 11). The nanosheet-based structures 100B in regions 650, 670 can be completed as nanosheet FET devices by depositing a low resistivity metal fill (e.g., tungsten (W)) (not shown) between the offset gate spacers 302 (shown in FIG. 5B) and over the cap layer 1202. Contacts (not shown) can be communicatively coupled to the S/D regions 602, 604 (shown in FIGS. 5A, 5B) and the low resistivity metal fill. The final nanosheet FETs formed in region 650 can be NFET or PFET. Using the fabrication methods and resulting structures in accordance with embodiments of the invention, high threshold voltage NFETs or low threshold voltage PFETs can be formed in region 650. Similarly, using the fabrication methods and resulting structures in accordance with embodiments of the invention, high threshold voltage PFETs or low threshold voltage NFETs can be formed in region 670.

Figure 13:
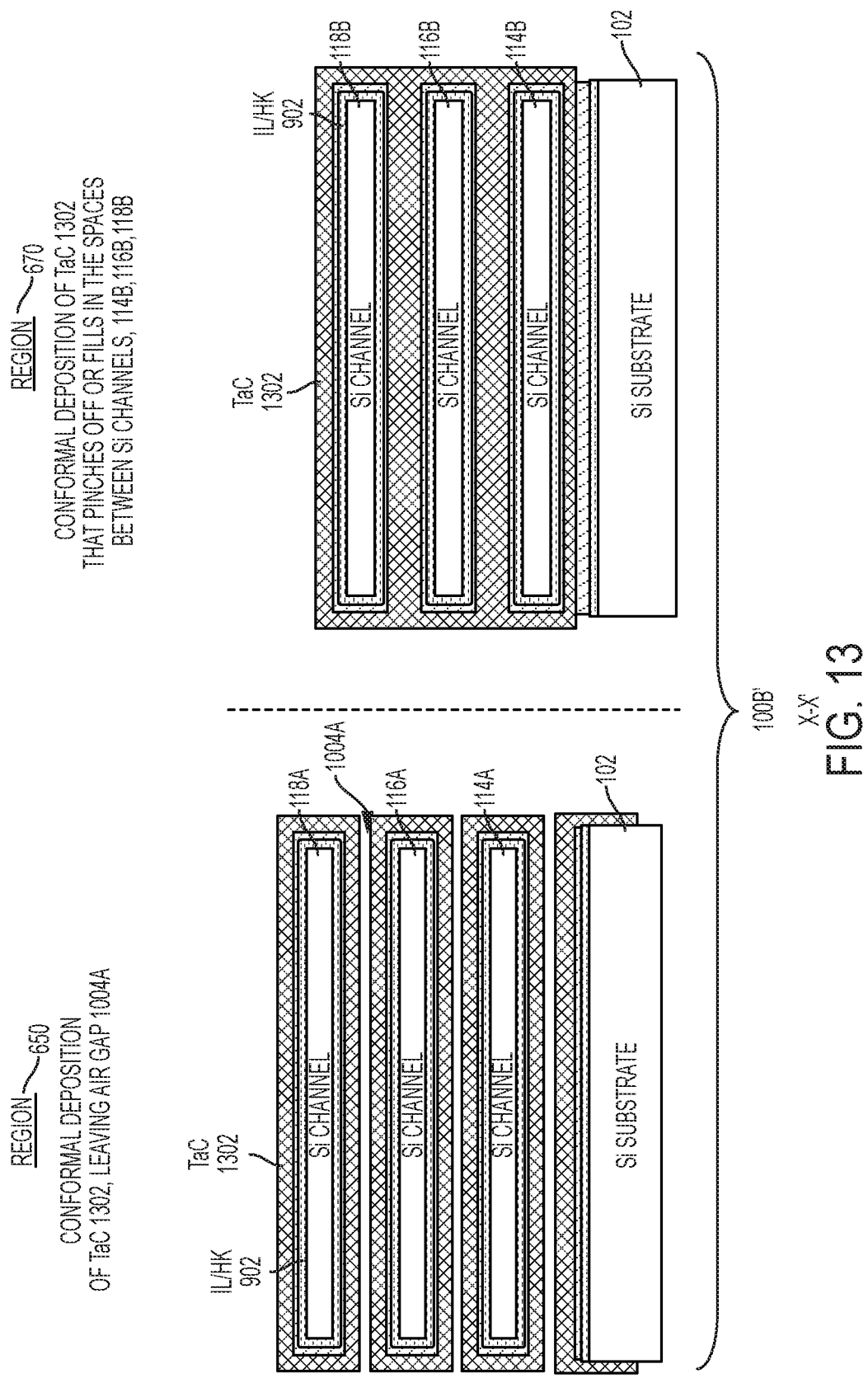
Figure 14:
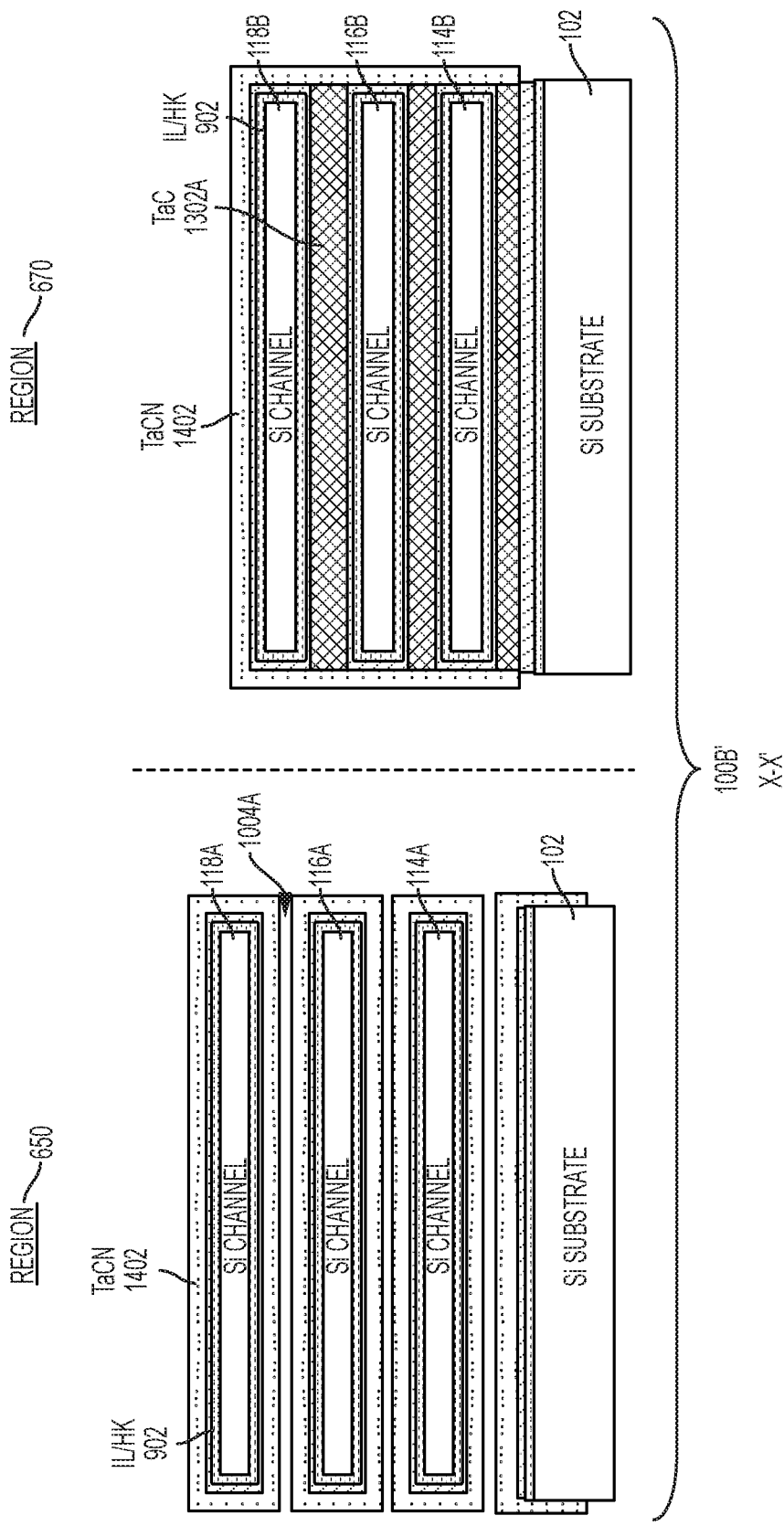
Figure 15:
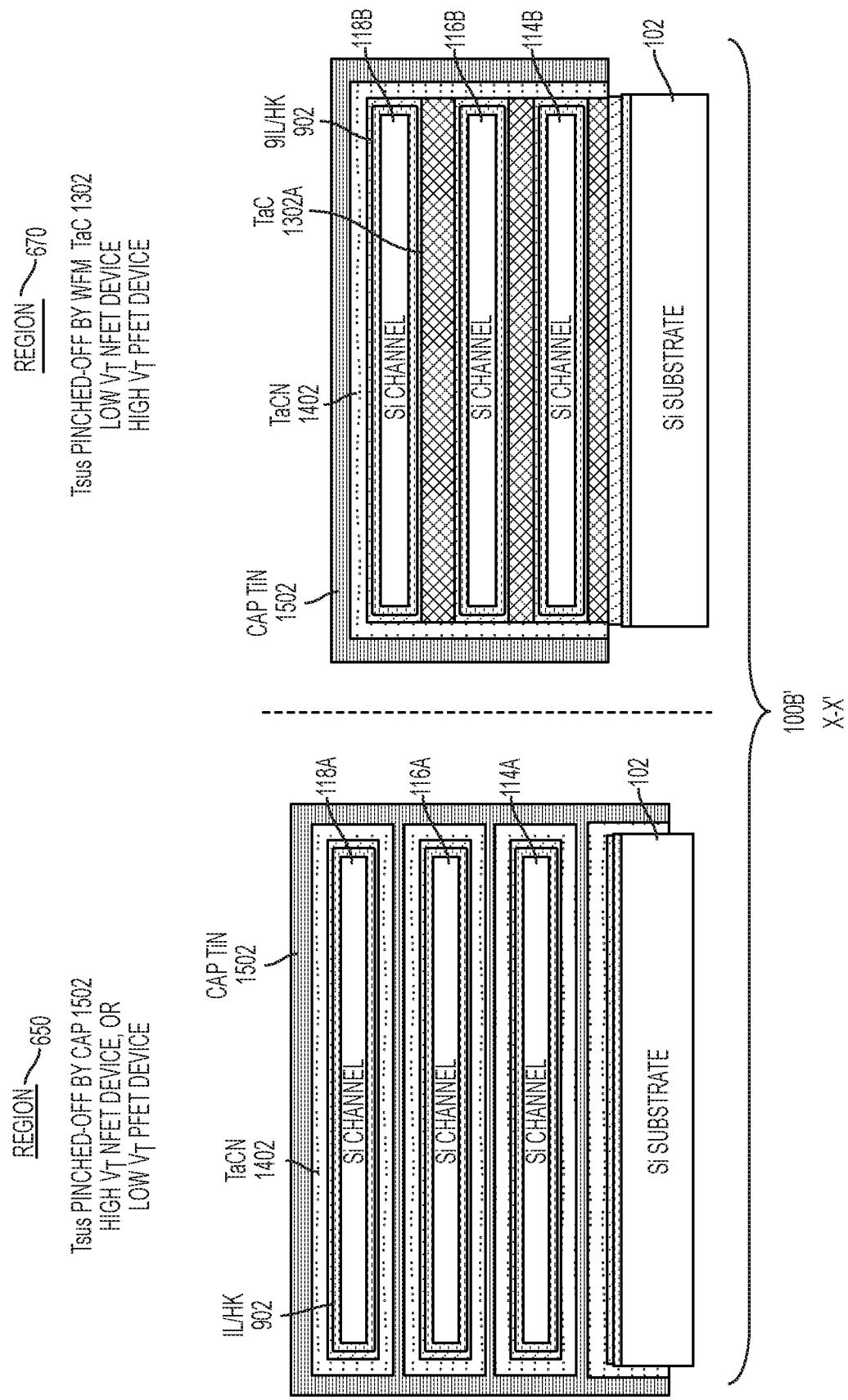

FIGS. 13-15 depict cross-sectional views (taken along line X'X') of a nanosheet-based structure 100B', which is the nanosheet-based structure 100A' shown in FIG. 9 after various fabrication operations to form gate structures configured and arranged to provide separately tunable threshold voltages in region 650 and region 670 in accordance with embodiments of the invention. In FIG. 13, known semiconductor fabrication operations have been used to a conformal and relatively thin gate dielectric 902 has been deposited around each channel nanosheet 114A, 116A, 118A in region 650 and each channel nanosheet 114B, 116B, 118B in region 670. In embodiments of the invention, the gate dielectric 902 is relatively thin (e.g., about 1.75 nm). In embodiments of the invention, the relatively thin gate dielectric layer 902 can be formed from one or more gate dielectric films such as thermally oxidized Si or SiGe, thermally oxidized and nitrided Si or SiGe, an interlayer dielectric (ILD) material and a high-k dielectric. The gate dielectric films can be a dielectric material having a dielectric constant greater than, for example, 3.9, 7.0, or 10.0. Non-limiting examples of suitable materials for the high-k dielectric films include oxides, nitrides, oxynitrides, silicates (e.g., metal silicates), aluminates, titanates, nitrides, or any combination thereof. Examples of high-k materials with a dielectric constant greater than 7.0 include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The gate dielectric films can further include dopants such as, for example, lanthanum and aluminum. The gate dielectric films can be formed by suitable deposition processes, for example, CVD, PECVD, atomic layer deposition (ALD), evaporation, physical vapor deposition (PVD), chemical solution deposition, or other like processes.

As also shown in FIG. 13, known semiconductor fabrication operations have been used to conformally deposit an undoped WFM 1302 around the gate dielectric 902 and the channel layers 114A, 116A, 118A in region 650 and around the gate dielectric 902 and the channel layers 114B, 116B, 118B in region 670. In embodiments of the invention, the undoped WFM 1302 is TaC. In embodiments of the invention, the conformal deposition of the WFM 1302 is performed by an ALD process. In embodiments of the invention, the thickness of the undoped WFM 1302 is sufficient to leaves air gaps 1004A between each of the channel nanosheets 114A, 116A, 118A in region 650. Because the T1$a$-space (i.e., the space between the channel nanosheets 114A, 116A, 118A in region 650) is greater than the T1$b$-space (i.e., the space between the channel nanosheets 114B, 116B, 118B in region 670), the thickness of the undoped WFM 1302 is sufficient to pinch off in the space between each of the channel nanosheets 114B, 116B, 118B in region 670.

In FIG. 14, the work function of the deposited undoped WFM 1302 is tuned by applying a doping process that introduces dopant(s) into the WFM 1302. In embodiments of the invention, the doping process includes exposing the deposited WFM 1302 in both regions 650, 670 to a dopant carrying gas at a preselected time/duration/ and in a preselected ambient environment. For example, the temperature can be from about 660 Celsius to about 800 Celsius, the dopant can be nitrogen (N), and the dopant carrying gas and the ambient can be $NH_3$. In accordance with aspects of the invention, in region 650, the air gap 1004A creates additional surface areas of the WFM 1302, and these additional surface areas provide additional access points for the doping agent to drive dopants into the WFM 1302 to create doped WFM 1402 in region 650. In accordance with aspects of the invention, the threshold voltages of nanosheet transistors formed from the nanosheet-based structure 100B' in region 650 can be tuned/controlled by tuning/controlling the type of gate metal used to form the WFM 1302, the type of dopant(s) used to form the doped WFM 1402, the thickness of the WFM 1302, 1402, the thickness/length of the air gap 1004A, and the temperature/duration/ambient of the doping process (depicted in FIG. 14). In embodiments of the invention, region 650 of the substrate 102 can be referred to as an air-gap region 650.

In embodiments of the invention, when the above-described doping process is applied, the duration/temperature/time of the doping process is only sufficient to dope a portion of the WFM 1302. Accordingly, after application of the above-described doping process in region 670, WFM 1402 is formed in region 670, but an area of the undoped WFM 1302A remains. This area of undoped WFM 1302A is referred to herein as a pinch off area 1302A. In accordance with aspects of the invention, the threshold voltages of nanosheet transistors formed from the nanosheet-based structure 100B' in region 670 can be tuned/controlled by tuning/controlling the type of gate metal used to form the WFM 1302, the type of dopant(s) used to form the doped WFM 1402, the thickness of the WFM 1302, the thickness/length of the pinch off area 1302A, and the temperature/duration/ambient of the doping process (depicted in FIG. 14). In embodiments of the invention, region 670 of the substrate 102 can be referred to as a pinch off region 670.

In FIG. 15, a cap 1502 is conformally deposited in region 650 and 670. In embodiments of the invention, the cap layer 1502 can be formed from a nitride or an oxide layer. In region 650, the cap material (e.g., TiN) that forms the cap 1502 pinches off in the air gap 1004A (shown in FIG. 14). The nanosheet-based structures 100B' in regions 650, 670 can be completed as nanosheet FET devices by depositing a low resistivity metal fill (e.g., tungsten (W)) (not shown) between the offset gate spacers 302 (shown in FIG. 5B) and over the cap layer 1502. Contacts (not shown) can be communicatively coupled to the S/D regions 602, 604 (shown in FIGS. 5A, 5B) and the low resistivity metal fill. The final nanosheet FETs formed in region 650 can be NFET or PFET. Using the fabrication methods and resulting structures in accordance with embodiments of the invention, high threshold voltage NFETs or low threshold voltage PFETs can be formed in region 650. Similarly, using the fabrication methods and resulting structures in accordance with embodiments of the invention, high threshold voltage PFETs or low threshold voltage NFETs can be formed in region 670.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Thus, it can be seen from the foregoing detailed description that embodiments of the invention provide technical effects and benefits. For example, embodiments of the invention provide fabrication methods to achieve multiple threshold voltages for nanosheet FET devices without requiring additional work function metal patterning schemes. By adjusting the suspension spacing (spacing between channel nanosheets—Tsus), the work function metal (e.g., TiN) will be pinched off when the deposited work function metal thickness is greater than (Tsus−2*gate-dielectric thickness)/2. By exploiting the work function metal pinch-off condition, selective doping (e.g., oxygen or fluorine) can be applied to the work function method, thereby enabling selective work function tuning.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal,"

"top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a semiconductor device, the method comprising:

performing first fabrication operations to form nanosheet field effect transistor (FET) devices in a first region of a substrate;

wherein the first fabrication operations include:
forming a first channel nanosheet;
forming a second channel nanosheet over the first channel nanosheet;
forming a first gate structure around the first channel nanosheet;
forming a second gate structure around the second channel nanosheet, wherein an air gap is between the first gate structure and the second gate structure; and
applying a dopant to the first gate structure and the second gate structure, wherein the dopant is configured to enter the air gap and penetrate into the first gate structure and the second gate structure from within the air gap.

2. The method of claim 1, wherein applying the dopant comprises exposing the first gate structure and the second gate structure to a dopant carrying gas.

3. The method of claim 2, wherein applying the dopant further comprises applying an anneal at a temperature within a range from about 350 Celsius to about 450 Celsius.

4. The method of claim 3, wherein applying the dopant further comprising exposing the first gate structure and the second gate structure to an ambient comprising nitrogen.

5. The method of claim 4, wherein the dopant comprises oxygen.

6. The method of claim 4, wherein the dopant comprises fluorine.

7. The method of claim 2, wherein:
applying the dopant further comprises applying an anneal at a temperature within a range from about 600 Celsius to about 800 Celsius; and
the dopant comprises nitrogen.

8. The method of claim 3, wherein a threshold voltage of each of the nanosheet FET devices in the first region is controlled by:
a material type that forms the first gate structure;
a material type that forms the second gate structure;
the dopant;
a thickness dimension of the first gate structure;
a thickness dimension of the second gate structure;
a temperature of the anneal; and
a duration of the anneal.

9. The method of claim 1 further comprising:
performing second fabrication operations to form nanosheet field effect transistor (FET) devices in a second region of a substrate;
wherein the second fabrication operations include:
forming a third channel nanosheet;
forming a fourth channel nanosheet over the third channel nanosheet;
forming a third gate structure around the third channel nanosheet;
forming a fourth gate structure around the fourth channel nanosheet, wherein the third gate structure and the fourth gate structure pinch off in a pinch off area between the third gate structure and the fourth gate structure; and
applying the dopant to the third gate structure and the fourth gate structure, wherein the dopant is configured to penetrate into the gate structure and the fourth gate structure to formed a doped area of the third gate structure and a doped area of the fourth gate structure;
wherein at least a portion of the pinch off area remains undoped after applying the dopant.

10. The method of claim 9, wherein applying the dopant comprises exposing the first gate structure, the second gate structure, the third gate structure and the fourth gate structure to the dopant carrying gas.

11. The method of claim 10, wherein applying the dopant further comprises applying an anneal at a temperature within a range from about 350 Celsius to about 450 Celsius.

12. The method of claim 11, wherein applying the dopant further comprising exposing the first gate structure and the second gate structure to an ambient comprising nitrogen.

13. The method of claim 12, wherein the dopant comprises oxygen.

14. The method of claim 12, wherein the dopant comprises fluorine.

15. The method of claim 10, wherein:
applying the dopant further comprises applying an anneal at a temperature within a range from about 600 Celsius to about 800 Celsius; and
the dopant comprises nitrogen.

16. The method of claim 10, wherein a threshold voltage of each of the nanosheet FET devices in the first region is controlled by:
a material type that forms the first gate structure;
a material type that forms the second gate structure;
the dopant;
a thickness dimension of the first gate structure;
a thickness dimension of the second gate structure;
a temperature of the anneal; and
a duration of the anneal.

17. The method of claim 16, wherein a threshold voltage of each of the nanosheet FET devices in the second region is controlled by:
a material type that forms the third gate structure;
a material type that forms the fourth gate structure;
the dopant;
a thickness dimension of the third gate structure;
a thickness dimension of the fourth gate structure;
the temperature of the anneal; and
the duration of the anneal.

* * * * *